(12) United States Patent
Oh et al.

(10) Patent No.: US 7,826,294 B2
(45) Date of Patent: Nov. 2, 2010

(54) MEMORY WITH OUTPUT CONTROL

(75) Inventors: HakJune Oh, Kanata (CA); Hong Beom Pyeon, Kanata (CA); Jin-Ki Kim, Kanata (CA)

(73) Assignee: Mosaid Technologies Incorporated, Ottawa, Ontario (CA)

( * ) Notice: Subject to any disclaimer, the term of this patent is extended or adjusted under 35 U.S.C. 154(b) by 0 days.

(21) Appl. No.: 12/275,701

(22) Filed: Nov. 21, 2008

(65) Prior Publication Data
US 2009/0073768 A1 Mar. 19, 2009

Related U.S. Application Data

(63) Continuation of application No. 11/583,354, filed on Oct. 19, 2006, now Pat. No. 7,515,471, which is a continuation-in-part of application No. 11/324,023, filed on Dec. 30, 2005, now Pat. No. 7,652,922.

(60) Provisional application No. 60/847,790, filed on Sep. 27, 2006, provisional application No. 60/722,368, filed on Sep. 30, 2005.

(51) Int. Cl.
G11C 7/00 (2006.01)
(52) U.S. Cl. .................... 365/221; 365/185.11; 365/219
(58) Field of Classification Search ............ 365/185.11, 365/221, 230.05, 185.33
See application file for complete search history.

(56) References Cited

U.S. PATENT DOCUMENTS

| 4,174,536 A | 11/1979 | Misunas et al. |
| 4,573,147 A | 2/1986 | Aoyama et al. |
| 4,617,566 A | 10/1986 | Diamond |
| 4,679,173 A | 7/1987 | Sato |
| 4,733,376 A | 3/1988 | Ogawa |
| 4,796,231 A | 1/1989 | Pinkham |
| 4,899,316 A | 2/1990 | Nagami |
| 5,038,299 A | 8/1991 | Maeda |
| 5,126,808 A | 6/1992 | Montalvao et al. |

(Continued)

FOREIGN PATENT DOCUMENTS

EP    1424635 A1    6/2004

(Continued)

OTHER PUBLICATIONS

European Patent Application No. 06790773.3 Search Report dated Jan. 15, 2009.

(Continued)

Primary Examiner—Gene N. Auduong
(74) Attorney, Agent, or Firm—Shin Hung; Borden Ladner Gervais LLP

(57) ABSTRACT

An apparatus, system, and method for controlling data transfer to an output port of a serial data link interface in a semiconductor memory is disclosed. In one example, a flash memory device may have multiple serial data links, multiple memory banks and control input ports that enable the memory device to transfer the serial data to a serial data output port of the memory device. In another example, a flash memory device may have a single serial data link, a single memory bank, a serial data input port, a control input port for receiving output enable signals. The flash memory devices may be cascaded in a daisy-chain configuration using echo signal lines to serially communicate between memory devices.

29 Claims, 31 Drawing Sheets

U.S. PATENT DOCUMENTS

| | | |
|---|---|---|
| 5,132,635 A | 7/1992 | Kennedy |
| 5,136,292 A | 8/1992 | Ishida |
| 5,175,819 A | 12/1992 | Le Ngoc et al. |
| 5,204,669 A | 4/1993 | Dorfe et al. |
| 5,243,703 A | 9/1993 | Farwald et al. |
| 5,280,539 A | 1/1994 | Yeom et al. |
| 5,319,598 A | 6/1994 | Aralis et al. |
| 5,336,951 A | 8/1994 | Josephson et al. |
| 5,365,484 A | 11/1994 | Cleveland et al. |
| 5,384,735 A | 1/1995 | Park et al. |
| 5,404,460 A | 4/1995 | Thomsen et al. |
| 5,430,859 A | 7/1995 | Norman et al. |
| 5,440,694 A | 8/1995 | Nakajima |
| 5,452,259 A | 9/1995 | McLaury |
| 5,473,563 A | 12/1995 | Suh et al. |
| 5,473,566 A | 12/1995 | Rao |
| 5,473,577 A | 12/1995 | Miyake et al. |
| 5,475,854 A | 12/1995 | Thomsen et al. |
| 5,596,724 A | 1/1997 | Mullins et al. |
| 5,602,780 A | 2/1997 | Diem et al. |
| 5,636,342 A | 6/1997 | Jeffries |
| 5,671,178 A | 9/1997 | Park et al. |
| 5,721,840 A | 2/1998 | Soga |
| 5,729,683 A | 3/1998 | Le et al. |
| 5,740,379 A | 4/1998 | Hartwig |
| 5,761,146 A | 6/1998 | Yoo et al. |
| 5,768,212 A | 6/1998 | Fujita |
| 5,771,199 A | 6/1998 | Lee |
| 5,778,419 A | 7/1998 | Hansen et al. |
| 5,802,006 A | 9/1998 | Ohta |
| 5,802,399 A | 9/1998 | Yumoto et al. |
| 5,806,070 A | 9/1998 | Norman et al. |
| 5,818,785 A | 10/1998 | Ohshima |
| 5,828,899 A | 10/1998 | Richard et al. |
| 5,835,935 A | 11/1998 | Estakhri et al. |
| 5,844,846 A | 12/1998 | Jang |
| 5,844,858 A | 12/1998 | Kyung |
| 5,859,809 A | 1/1999 | Kim |
| 5,872,994 A | 2/1999 | Akiyama et al. |
| 5,896,400 A | 4/1999 | Roohparvar et al. |
| 5,900,021 A | 5/1999 | Tiede et al. |
| 5,937,425 A | 8/1999 | Ban |
| 5,941,974 A | 8/1999 | Babin |
| 5,959,890 A | 9/1999 | Yamamoto et al. |
| 5,959,930 A | 9/1999 | Sakurai |
| 5,964,857 A | 10/1999 | Srinivasan et al. |
| 5,966,723 A | 10/1999 | James et al. |
| 5,995,417 A | 11/1999 | Chen et al. |
| 6,002,638 A | 12/1999 | John |
| 6,064,627 A | 5/2000 | Sakurai |
| 6,085,290 A | 7/2000 | Smith et al. |
| 6,091,660 A | 7/2000 | Sasaki et al. |
| 6,102,963 A | 8/2000 | Agrawal |
| 6,107,658 A | 8/2000 | Itoh et al. |
| 6,144,576 A | 11/2000 | Leddige et al. |
| 6,144,579 A | 11/2000 | Taira |
| 6,148,363 A | 11/2000 | Lofgren et al. |
| 6,148,364 A | 11/2000 | Srinivasan et al. |
| 6,178,135 B1 | 1/2001 | Kang |
| 6,215,726 B1 | 4/2001 | Kubo |
| 6,304,921 B1 | 10/2001 | Rooke |
| 6,317,350 B1 | 11/2001 | Pereira et al. |
| 6,317,352 B1 | 11/2001 | Halbert et al. |
| 6,317,812 B1 | 11/2001 | Lofgren et al. |
| 6,438,064 B2 | 8/2002 | Ooishi |
| 6,442,098 B1 | 8/2002 | Kengeri |
| 6,453,365 B1 | 9/2002 | Habot |
| 6,535,948 B1 | 3/2003 | Wheeler et al. |
| 6,584,303 B1 | 6/2003 | Kingswood et al. |
| 6,594,183 B1 | 7/2003 | Lofgren et al. |
| 6,601,199 B1 | 7/2003 | Fukuda et al. |
| 6,611,466 B2 | 8/2003 | Lee et al. |
| 6,658,509 B1 | 12/2003 | Bonella et al. |
| 6,658,582 B1 | 12/2003 | Han |
| 6,680,904 B1 | 1/2004 | Kaplan et al. |
| 6,715,044 B2 | 3/2004 | Lofgren et al. |
| 6,732,221 B2 | 5/2004 | Ban |
| 6,754,807 B1 | 6/2004 | Parthasarathy et al. |
| 6,763,426 B1 | 7/2004 | James et al. |
| 6,792,003 B1 | 9/2004 | Potluri et al. |
| 6,792,033 B1 | 9/2004 | Maruta et al. |
| 6,807,103 B2 | 10/2004 | Cavaleri et al. |
| 6,816,933 B1 | 11/2004 | Andreas |
| 6,850,443 B2 | 2/2005 | Lofgren et al. |
| 6,853,557 B1 | 2/2005 | Haba et al. |
| 6,853,573 B2 | 2/2005 | Kim et al. |
| 6,906,978 B2 | 6/2005 | Elzur et al. |
| 6,928,501 B2 | 8/2005 | Andreas et al. |
| 6,944,697 B2 | 9/2005 | Andreas |
| 6,945,465 B2 | 9/2005 | Nishizawa et al. |
| 6,950,325 B1 | 9/2005 | Chen |
| 6,965,539 B2 | 11/2005 | Lee |
| 6,967,874 B2 | 11/2005 | Hosono |
| 6,996,644 B2 | 2/2006 | Schoch et al. |
| 7,031,221 B2 | 4/2006 | Mooney et al. |
| 7,058,776 B2 | 6/2006 | Lee |
| 7,062,601 B2 | 6/2006 | Becca et al. |
| 7,073,022 B2 | 7/2006 | El-Batal et al. |
| 7,111,085 B2 | 9/2006 | Estakhri et al. |
| 7,111,140 B2 | 9/2006 | Estakhri et al. |
| 7,130,958 B2 | 10/2006 | Chou et al. |
| 7,151,705 B2 | 12/2006 | Polizzi et al. |
| 7,161,842 B2 | 1/2007 | Park |
| 7,194,581 B2 | 3/2007 | Vogt |
| 7,202,545 B2 | 4/2007 | Perner |
| 7,254,660 B2 | 8/2007 | Yamamoto |
| 7,254,663 B2 | 8/2007 | Bartley et al. |
| 7,302,517 B2 | 11/2007 | Lim et al. |
| 7,308,524 B2 | 12/2007 | Grundy et al. |
| 7,334,070 B2 * | 2/2008 | Borkenhagen ............... 710/100 |
| 7,433,258 B2 * | 10/2008 | Rao et al. ............. 365/230.03 |
| 7,515,471 B2 * | 4/2009 | Oh et al. ................. 365/185.11 |
| 2004/0001380 A1 | 1/2004 | Becca et al. |
| 2004/0019736 A1 | 1/2004 | Kim et al. |
| 2004/0024960 A1 | 2/2004 | King et al. |
| 2004/0039854 A1 | 2/2004 | Estakhri et al. |
| 2004/0148482 A1 * | 7/2004 | Grundy et al. ............... 711/167 |
| 2004/0199721 A1 | 10/2004 | Chen |
| 2005/0073899 A1 | 4/2005 | Gallivan et al. |
| 2005/0138267 A1 | 6/2005 | Bains et al. |
| 2005/0160218 A1 | 7/2005 | See et al. |
| 2005/0166006 A1 | 7/2005 | Talbot et al. |
| 2006/0020740 A1 | 1/2006 | Bartley et al. |
| 2006/0044872 A1 | 3/2006 | Nazarian |
| 2006/0198202 A1 | 9/2006 | Erez |
| 2007/0076502 A1 * | 4/2007 | Pyeon et al. ................. 365/221 |
| 2007/0153576 A1 | 7/2007 | Oh et al. |
| 2007/0165457 A1 * | 7/2007 | Kim ..................... 365/185.11 |
| 2008/0144411 A1 | 6/2008 | Tsern |
| 2008/0279003 A1 | 11/2008 | Kim et al. |

FOREIGN PATENT DOCUMENTS

| | | |
|---|---|---|
| EP | 1457993 A2 | 9/2004 |
| WO | 0169411 A1 | 9/2001 |

OTHER PUBLICATIONS

"DiskOnChip H1 4Gb (512MByte) and 8 Gb (1 Gbyte) High Capacity Flash Disk with Nand and x2 Technology," Data Sheet, Rev. 0.5 (preliminary), M-Systems Flash Disk Pioneers Ltd., pp. 1-66, (2005).

Tal, A., "Guidelines for Integrating DiskOnChip in a Host System," AO-DOC-1004, Rev. 1.0, M-Systems Flash Disk Pioneers Ltd., pp. 1-15, (2004).

OneNAND4G(KFW4G16Q2M-DEB6), OneNAND2G(KFH2G16Q2M-DEB6), OneNAND1G(KFW1G16Q2M-DEB6) Flash Memory, OneNAND™ Specification Ver. 1.2, Samsung Electronics, pp. 1-125, (Dec 23, 2005).

Kennedy, J., et al., "A 2Gb/s Point-to-Point Heterogeneous Voltage Capable DRAM Interface for Capacity-Scalable Memory Subsystems," ISSCC 2004/Session 1/Dram/11.8, IEEE International Solid-State Circuites Conference (2004), vol. 1.

Kim, Jae-Kwan, et al., "A 3.6 Gb/s/pin Simulataneous Bidirectional (SBD) I/O Interface for High-Speed Dram", ISSCC 2004/Session 22/DSL and Multi-Gb/s I/O 22.7, IEEE International Solid State Circuits Conference (2004), vol. 1.

"Hyper Transport TM I/O Link Specification", Revision 2.00, Document No. HTC20031217-0036-00, HyperTransportTM Technology Consortium, pp. 1-325 (2001).

"IEEE Standard for High-Bandwidth Memory Interface Based on Scalable Coherent Interface (SCI) Signaling Technology (RamLink)", IEEE Std. 1596.4-1996, The Institute of Electrical Electronics Engineers, Inc., pp. i-91, (Mar. 1996).

"High-Speed Memory Architectures for Multimedia Applications", Circuits & Devices, IEEE, 8755-3996/97 pp. 8-13, Jan. 1997.

Gjessing, S., et al., "RamLink: A High-Bandwidth Point-to-Point Memory Architecture", IEEE 0-8186-2655-0/92, pp. 328-331, Feb. 24-28, 1992.

Gjessing, S., et al., "RamLink: A High-Bandwidth Point-to-Point Memory Architecture", Proceedings of the Twenty-Seventh Annual Hawaii International Conference on System Sciences, IEEE 1060-3424/94, pp. 154-162, 1994.

Gjessing, S., et al., "A RAM link for high speed", Special Report/ Memory, IEEE Spectrum, pp. 52-53, (Oct. 1992).

Diamond, S.L., "SyncLink: High-speed DRAM for the future", Micro Standards, IEEE Micro, pp. 74-75, (Dec. 1996).

King, et al.,"Communicating with Daisy Chained MCP42XXX Digital Potentiometers", Microchip AN747, pp. 1-8, 2001.

"Toshiba MOS Digital Integrated Circuit Silicon Gate CMOS", TH58NVG1S3AFT05, Toshiba Corporation, May 19, 2003 pp. 1-32.

"Intel® Advanced+ Boot Black Memory Flash (C3)", May 2005, Intel Corporation, pp. 1-72.

"High Speed Small Sectored SPI Flash Memory," Atmel Corp., pp. 1-22 (2006).

64 Megabit CMOS 3.0 Volt Flash Memory with 50 MHz SPI, Spansion, 2006, pp. 1-30.

"256 M×8 Bit/ 128m×16 Bit/ 512M×8 Bit NAND Flash Memory" K9K4G08U1M, K9F2G08U0m, K9F2G16U0m, Rev. 1.0, Samsung Electronics Co., Ltd., May 6, 2005, pp. 1-41.

"DDR2 Fully Buffered DIMM 240pin FBDIMMS based on 512Mb C-die", Rev. 1.3 Sep. 2006, Samsung Electroncs, pp. 1-32 (Sep. 2006).

Hyper Transport TM I/O Link Specification, Revision 3.00, Document No. HTC20051222-0046-0008, HyperTransport Technology Consortium, pp. 1-428 (Apr. 2006).

U.S. Appl. No. 12/179,835, Office Action dated Jan. 13, 2010.
U.S. Appl. No. 11/779,587, Notice of Allowance dated Feb. 2, 2010.
U.S. Appl. No. 11/779,587, Office Action dated Oct. 28, 2009.
U.S. Appl. No. 11/594,564, Office Action dated Dec. 1, 2008.
U.S. Appl. No. 11/594,564, Office Action dated Jun. 1, 2009.
U.S. Appl. No. 11/594,564, Office Action dated Sep. 2, 2009.
U.S. Appl. No. 11/496,278, Office Action dated Jun. 30, 2008.
U.S. Appl. No. 11/496,278, Office Action dated Dec. 31, 2008.
U.S. Appl. No. 11/496,278, Office Action dated May 14, 2009.
U.S. Appl. No. 11/496,278, Notice of Allowance dated Sep. 21, 2009, reissued Oct. 28, 2009.
U.S. Appl. No. 11/496,278, Office Action dated Feb. 18, 2010.
U.S. Appl. No. 12/179,835, Notice of Allowance dated Mar. 23, 2010.
U.S. Appl. No. 11/594,564, Office Action dated Apr. 1, 2010.

* cited by examiner

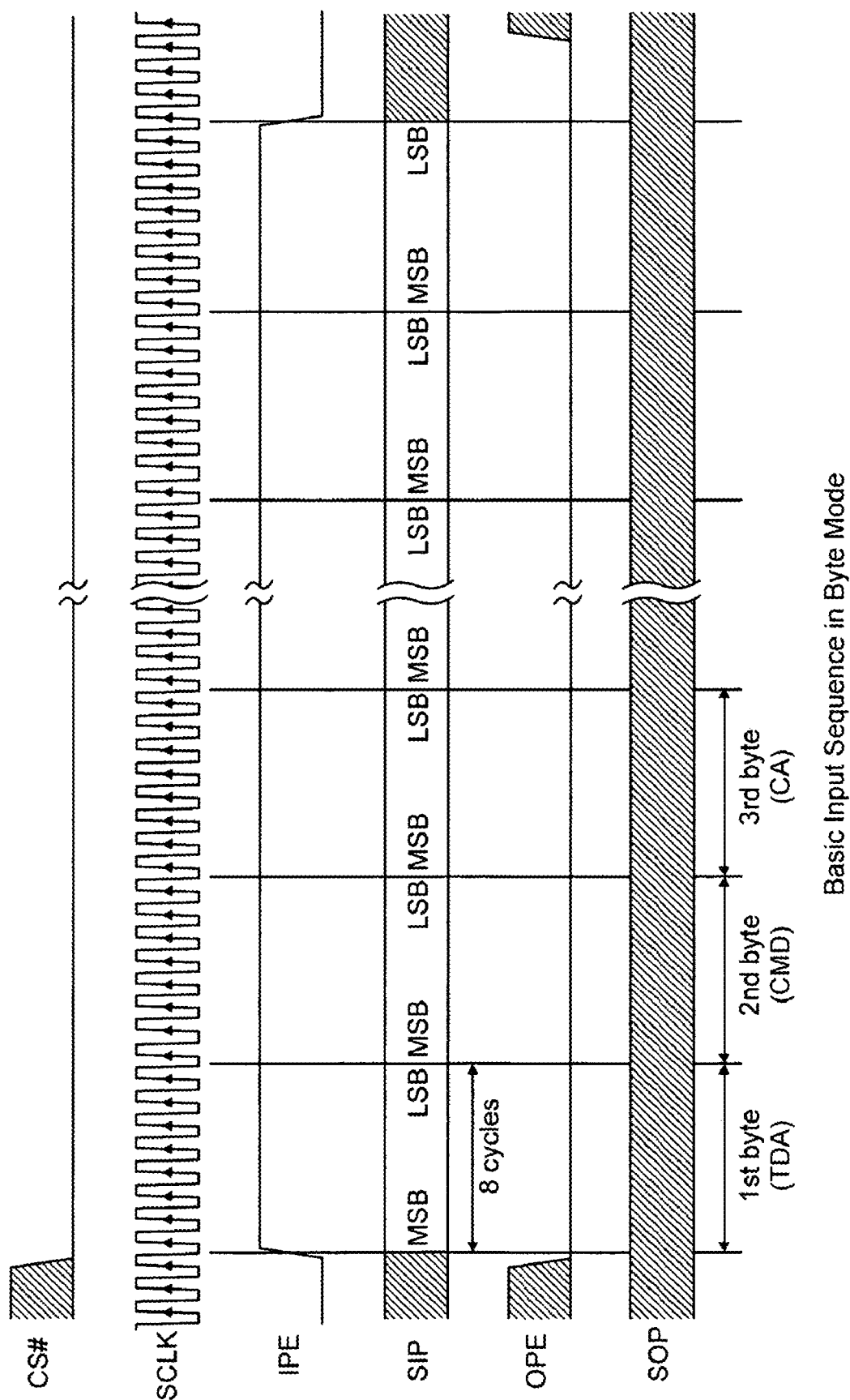

Basic Output Latch Timing

MEMORY WITH OUTPUT CONTROL

RELATED APPLICATIONS

This application is a continuation of U.S. application Ser. No. 11/583,354 filed on Oct. 19, 2006, now U.S. Pat. No. 7,515,471, issued Apr. 7, 2009, which is a Continuation-in-Part of U.S. application Ser. No. 11/324,023 filed on Dec. 30, 2005, now U.S. Pat. No. 7,652,922 issued Jan. 26, 2010, which claims the benefit of U.S. Provisional Application No. 60/722,368 filed on Sep. 30, 2005, entitled "Multiple Independent Serial Link Memory". U.S. application Ser. No. 11/583,354 filed on Oct. 19, 2006, now U.S. Pat. No. 7,515, 471, also claims the benefit of U.S. Provisional Application No. 60/847,790 filed on Sep. 27, 2006, entitled "Memory with Output Control and U.S. Provisional Application No. 60/772,368, filed on Sep. 30, 2005. The disclosures of the above applications are expressly incorporated herein by reference in their entirety.

FIELD OF THE INVENTION

The invention relates to semiconductor memory devices. More particularly, the invention relates to a memory architecture for improving the speed and/or capacity of semiconductor Flash memory devices.

BACKGROUND OF THE INVENTION

Mobile electronic devices, such as digital cameras, portable digital assistants, portable audio/video players and mobile terminals continue to require mass storage memory, preferably non-volatile memory with ever increasing capacities and speed capabilities. For example, presently available audio players can have between 256 Mbytes to 40 Gigabytes of memory for storing audio/video data. Non-volatile memory such as Flash memory and hard-disk drives are preferred since data is retained in the absence of power, thus extending battery life.

Presently, hard disk drives have high densities that can store 20 to 40 Gigabytes of data, but are relatively bulky. However, flash memory is popular because of its high density, non-volatility, and small size relative to hard disk drives. Flash memory technology is based on EPROM and EEPROM technologies. The term "flash" was chosen because a large number of memory cells could be erased at one time as distinguished from EEPROMs, where each byte was erased individually. The advent of multi-level cells (MLC) further increases Flash memory density relative to single level cells. Those of skill in the art will understand that Flash memory can be configured as NOR Flash or NAND Flash, with NAND Flash having higher density per given are due to its more compact memory array structure. For the purpose of further discussion, references to Flash memory should be understood as being either NOR or NAND or other type Flash memory.

While existing Flash memory modules operate at speeds sufficient for many current consumer electronic devices, such memory modules likely will not be adequate for use in further devices where high data rates are desired. For example, a mobile multimedia device that records high definition moving pictures is likely to require a memory module with a programming throughput of at least 10 MB/s, which is not obtainable with current Flash memory technology with typical programming data rates of 7 MB/s. Multi-level cell Flash has a much slower rate of 1.5 MB/s due to the multi-step programming sequence required to program the cells Programming and read throughput for Flash memory can be directly increased by increasing the operating frequency of the Flash memory. For example, the present operating frequency of about 20-30 MHz can be increased by an order of magnitude to about 200 MHz. While this solution appears to be straightforward, there is a significant problem with signal quality at such high frequencies, which sets a practical limitation on the operating frequency of the Flash memory. In particular, the Flash memory communicates with other components using a set of parallel input/output (I/O) pins, numbering 8 or 16 depending on the desired configuration, which receive command instructions, receive input data and provide output data. This is commonly known as a parallel interface. High speed operating will cause well known communication degrading effects such as cross-talk, signal skew and signal attenuation, for example, which degrades signal quality.

Such parallel interfaces use a large number of pins to read and write data. As the number of input pins and wires increases, so do a number of undesired effects. These effects include inter-symbol interferences, signal skew and cross talk. Inter-symbol interference results from the attenuation of signals traveling along a wire and reflections caused when multiple elements are connected to the wire. Signal skew occurs when signals travel along wires having different lengths and/or characteristics and arrive at an end point at different times. Cross talk refers to the unwanted coupling of signals on wires that are in close proximity. Cross talk becomes more of a problem as the operating speed of the memory device increases.

Therefore, there is a need in the art for memory modules, for use in mobile electronic devices, and solid-state drive applications that have increased memory capacities and/or operating speeds while minimizing the number input pins and wires required to access the memory modules.

SUMMARY OF THE INVENTION

The following represents a simplified summary of some embodiments of the invention in order to provide a basic understanding of various aspects of the invention. This summary is not an extensive overview of the invention. It is not intended to identify key or critical elements of the invention or to delineate the scope of the invention. Its sole purpose is to present some embodiments of the invention in simplified form as a prelude to the more detailed description that is presented below.

In accordance with an embodiment of the present invention, a semiconductor memory device includes a memory, a serial data link that transfers serial input data to the memory, and an input control signal. Control circuitry controls data transfer between the serial data link interface and the memory. Consistent with the principle of the present invention, the memory may be a single memory bank or multiple memory banks. The serial data link interface may convert serial input data into parallel data to be transferred to the memory bank. Additionally, the serial link interface may convert parallel data from the memory bank to serial output data. Various other aspects of the invention are also disclosed throughout the specification.

According to principles of the present invention, a flash memory system may have plurality of serially connected flash memory devices. The flash memory devices in the system include a serial input data port, a serial data output port, a plurality of control input ports, and a plurality of control output ports. The flash memory devices are configured to receive serial input data and control signals from an external source and to provide data and control signals to an external device. The external source and external device may be other flash memory devices within the system. In some embodiments of the present invention, each of the flash memory devices may include a unique device identifier. The devices may be configured parse a target device information field in serial input data to correlate target device information with the unique device identification number of the device to determine whether the device is the target device. The device may parse the target device information field prior to processing any additional input data received. If the memory device is not the target device, it may ignore the serial input data, thus saving additional processing time and resources.

According to embodiments of the present invention, a memory device and method fully serializes a single set of serial input and output pins which are SIP(Serial Input Port) and SOP (Serial Output Port) along with two control signals, IPE (Input Port Enable) and OPE (Output Port Enable), for the enabling/disabling of input/output ports respectively. This provides a memory controller maximum flexibility of data communication. The memory device of the present invention receives an information signal stream through its SIP port only when IPE stays in a 'High' logic state, and also the device transmits the output data signal stream through its SOP port only when OPE stays in a 'High' logic state. When IPE goes to 'High', referenced at rising edges of free-running Serial Clock signal (SCLK), the SIP port starts to receive consecutive serial input stream bytes which are device address byte, command byte, column address bytes, row address bytes and/or input data bytes in predetermined number of clock cycles for each operation cases. If IPE goes to a 'Low' state, the SIP port stops receiving input signal streaming bytes. When OPE signal goes to a 'High' state, the SOP port starts to output data referenced at rising edges of free-running Serial Clock signal (SCLK). If OPE goes to a 'Low' state, the SOP stops outputting data. Therefore, the memory controller can have more flexibility to control communication between memory devices and controller itself.

In addition, when devices are serially cascaded in a system they may further comprise output control ports that "echo" the received IPE and OPE signals to external devices. This allows the system to have point-to-point connected signal ports (e.g., SIP/SOP, IPE/IPEQ, OPE/OPEQ, SCLKI/SCLKO) to form a daisy-chain cascading scheme (versus broadcasting/multi-drop cascading scheme). These systems may use the unique device identification and target device selection address scheme, rather than using limited hardware physical device select pins, so that the whole system can be easily expanded as many as possible in terms of memory density without sacrificing system's overall performance.

BRIEF DESCRIPTION OF THE DRAWINGS

The present invention is illustrated by way of example and not limited in the accompanying figures in which like reference numerals indicate similar elements and in which:

FIGS. 16A and 16B illustrate timing diagrams for input latch timing and input sequence timing byte mode, respectively.

DETAILED DESCRIPTION

A serial data interface for a semiconductor memory is disclosed. The serial data interface can include one or more serial data links in communication with centralized control logic, where each serial data link can receive commands and data serially, and can provide output data serially. Each serial data link can access any memory bank in the memory for programming and reading of data. At least one advantage of a serial interface is a low-pin-count device with a standard pin-out that is the same from one density to another, thus, allowing compatible future upgrades to higher densities without board redesign.

Figure 1A:
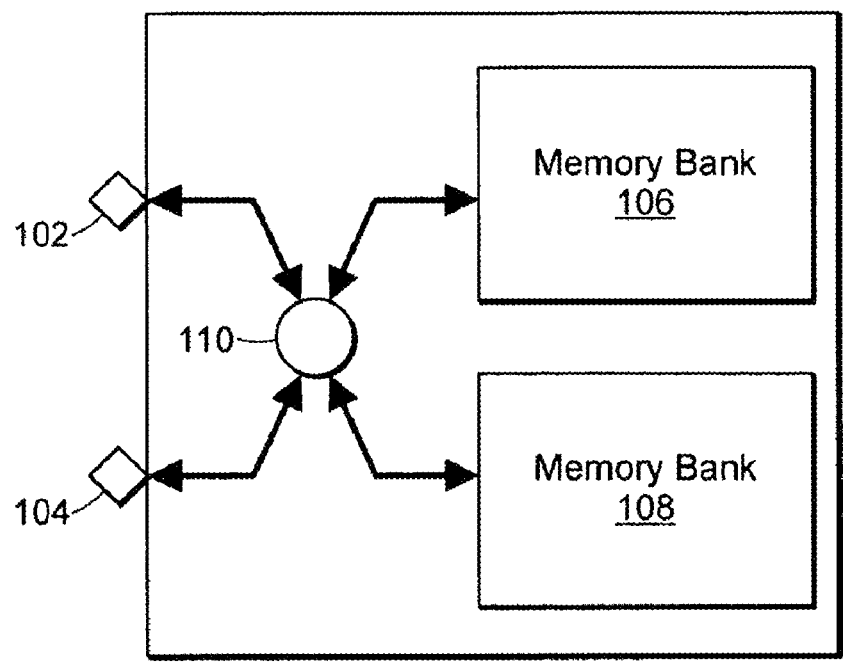
FIGS. 1A, 1B, 1C illustrate high level diagrams showing illustrative memory devices that allow for concurrent operations, in accordance with various aspects of the invention.
Figure 1B:
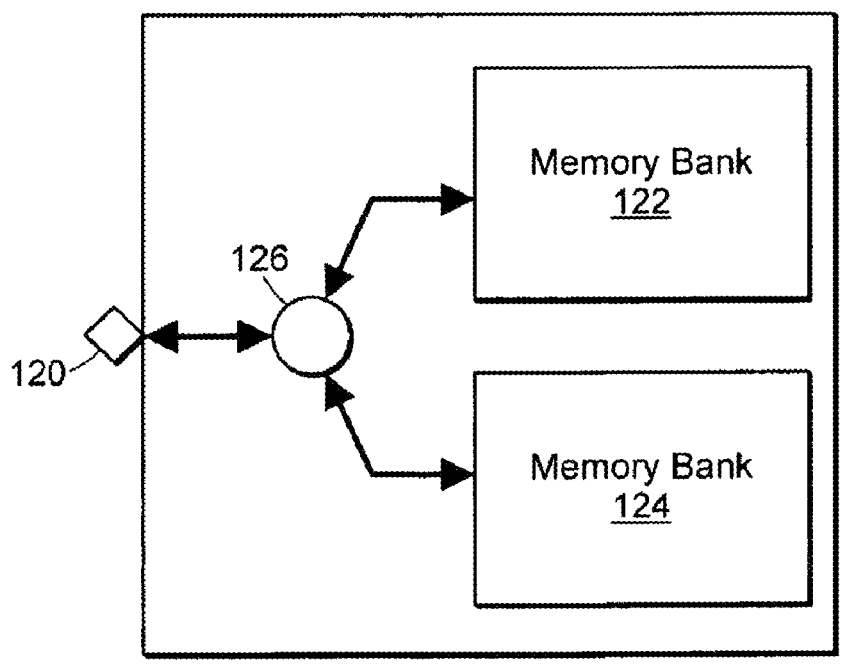

FIGS. 1A and 1B are high level diagrams showing illustrative memory devices that support concurrent operations, in accordance with various aspects of the invention. FIG. 1A shows a memory device having multiple serial data link interfaces 102 and 104 and multiple memory banks 106 and 108. The presently shown arrangement is referred to herein as a dual port configuration. Each serial data link interface has an associated input/output pin and data input and data output circuitry, which will be described in further detail with respect to FIG. 2A. Data transferred through a serial data link interface passes through in a serial fashion (e.g., as a single-bit-wide stream of data.) Each of the data link interfaces 102 and 104 in the memory device are independent and can transfer data to and from any of the memory banks 106 and 108. For example, serial data link 102 can transfer data to and from memory bank 106 or memory bank 108. Similarly, serial data link 104 can transfer data to and from memory bank 106 and memory bank 108. Since the two serial data link interfaces shown are independent, they can concurrently transfer data to and from separate memory banks. Link, as used herein, refers to the circuitry that provides a path for, and controls the transfer of, data to and from one or more memory banks. A control module 110 is configurable with commands to control the exchange of data between each serial data link interface 102 and 104 and each memory bank 106 and 108. For example, control module 110 can be configured to allow serial data link interface 102 to read data from memory bank 106 at the same time that serial data link interface 104 is writing data to memory bank 108. This feature provides enhanced flexibility for system design and enhanced device utilization (e.g., bus utilization and core utilization). As will be shown later, control module 110 can include control circuits, registers and switch circuits.

FIG. 1B shows an embodiment in which a single serial data link interface 120 is linked to multiple memory banks 122 and 124 via a control module 126. This presently shown arrangement is referred to herein as a single port configuration, and utilizes less memory device input/output pins than the dual port configuration shown in FIG. 1A. Control module 126 is configured to perform or execute two operating processes or threads, so that serial data link interface 120 can exchange data with memory banks 122 and 124 in a pipelined fashion. For example, while data is being written into memory bank 122, data link interface 120 can be reading data out of memory bank 124. In accordance with various aspects of the invention and as will be described in further detail below, the memory device emulates multiple link operations using a single link configuration with illustrated in FIG. 1B. Using this single link in conjunction with multiple banks configuration, also referred to herein as a virtual multiple link, any available bank can be accessed while the other bank may be in a busy state. As a result, the memory device can achieve enhanced utilization of a single link configuration by accessing the other available bank through link arbitration circuitry.

Figure 1C:
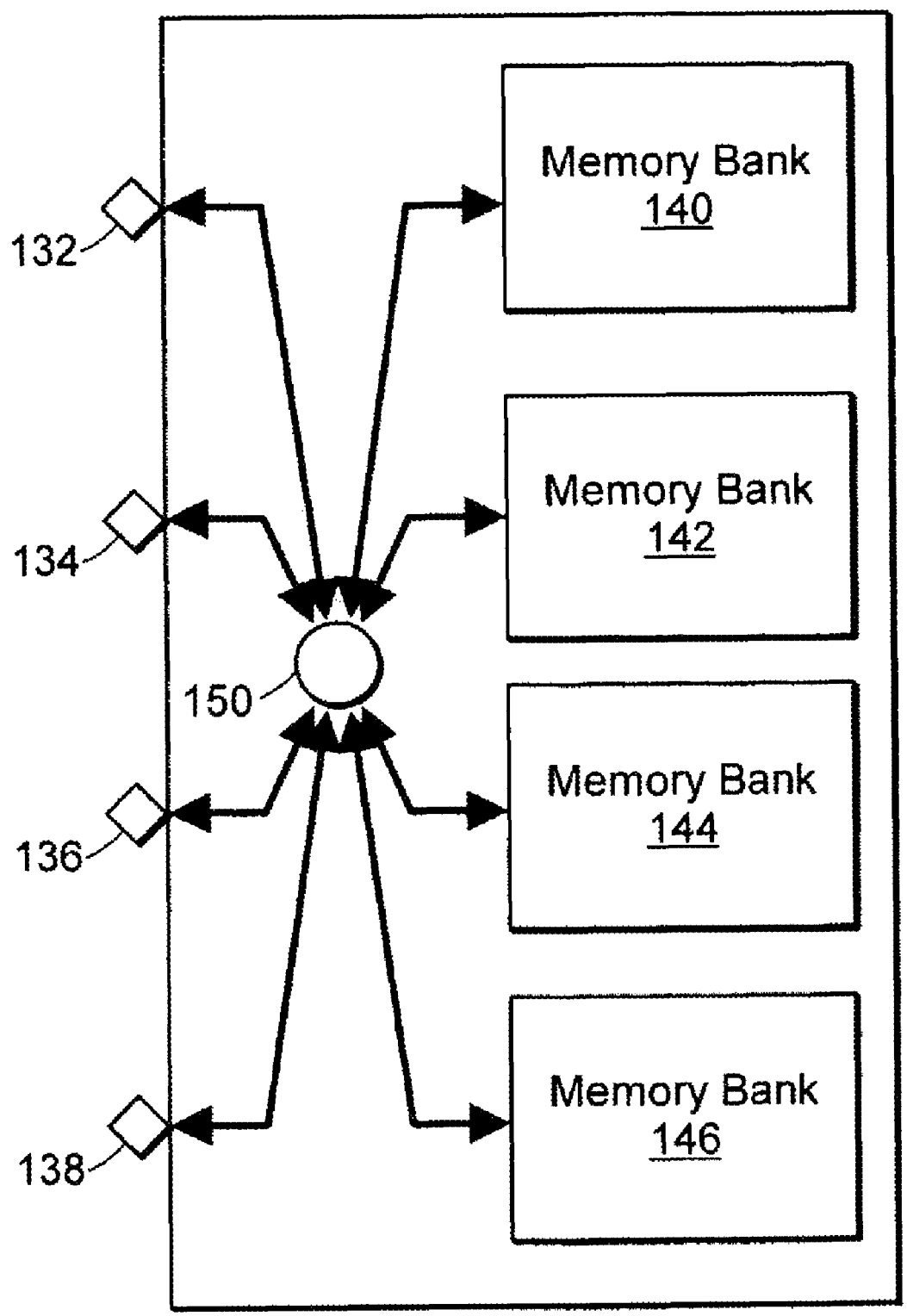
Figure 11:
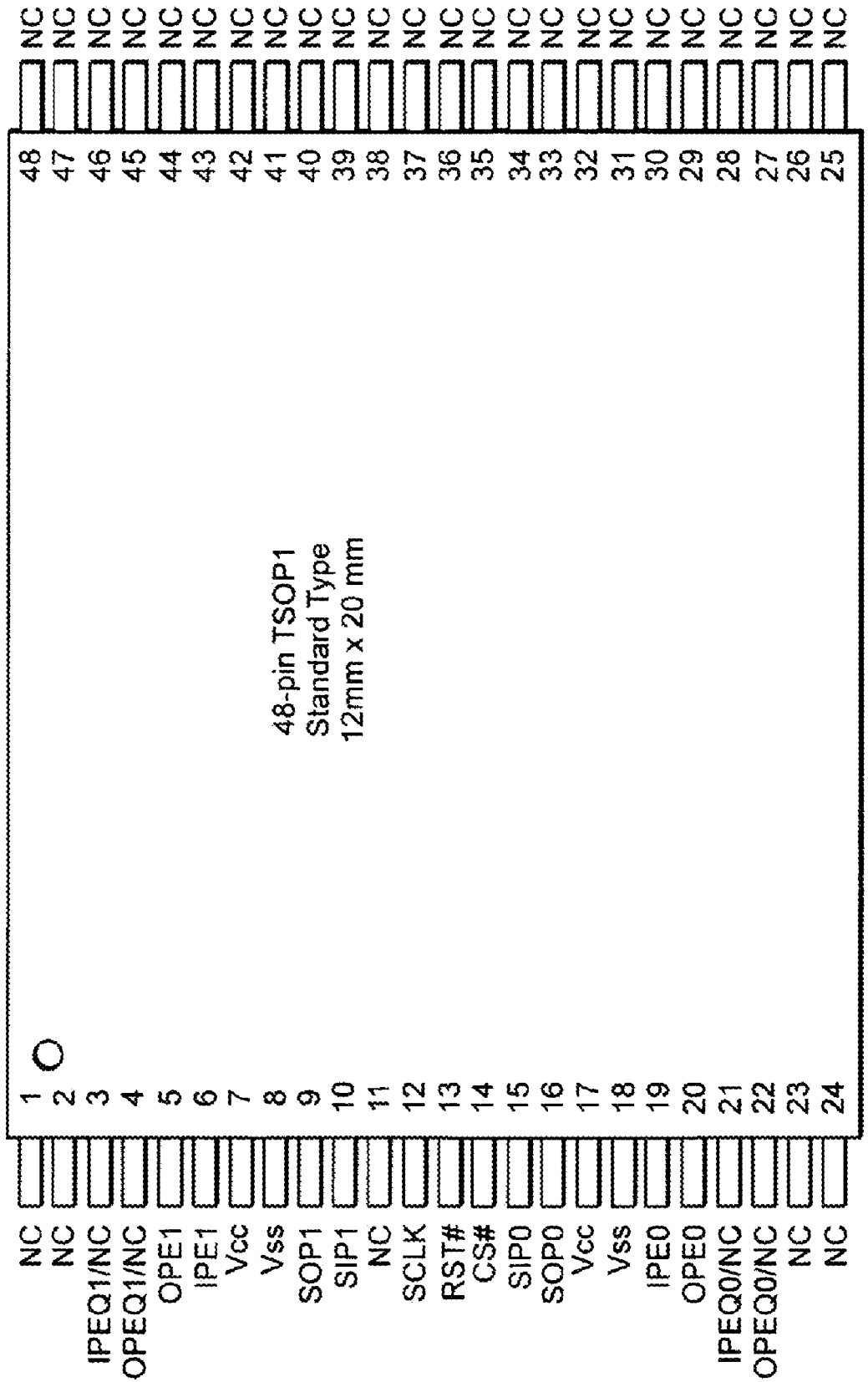
FIG. 11 illustrates a block diagram of the pin-out configuration of a memory device in device in accordance with various aspects of the invention.

The memory devices shown in FIGS. 1A and 1B include two memory banks for illustration purposes only. One skilled in the art will appreciate that several aspects of the invention disclosed herein are scalable and allow for the use of multiple memory banks and multiple serial data link interfaces. A single memory device may include, for example, 2, 4, or more memory banks. FIG. 1C shows an embodiment in which four independent serial data links 132, 134, 136 and 138 are configured to exchange data with four memory banks 140, 142, 144 and 146 under the control of a control module 150. With a virtual multiple link configuration only one link is necessary, so the remaining links (e.g., in FIG. 1A dual link or FIG. 1C quad link pinout configurations) are not used and may be considered as NC (i.e., No Connection). At least one advantage of a serial data link interface compared to a conventional parallel interface structure, is the reduced number of pins on the memory device while link flexibility and large density are maintained. For example, while a conventional flash memory device may require 48 pins over multiple sides of a package, a memory device in accordance with aspects of the invention may utilize fewer pins (e.g., 11 pins) on a single side of a standard package 1100, as illustrated in FIG. 11. Alternatively, a different and smaller type of package can be used instead, since there are less internal bond pads that are required.

Figure 2A:
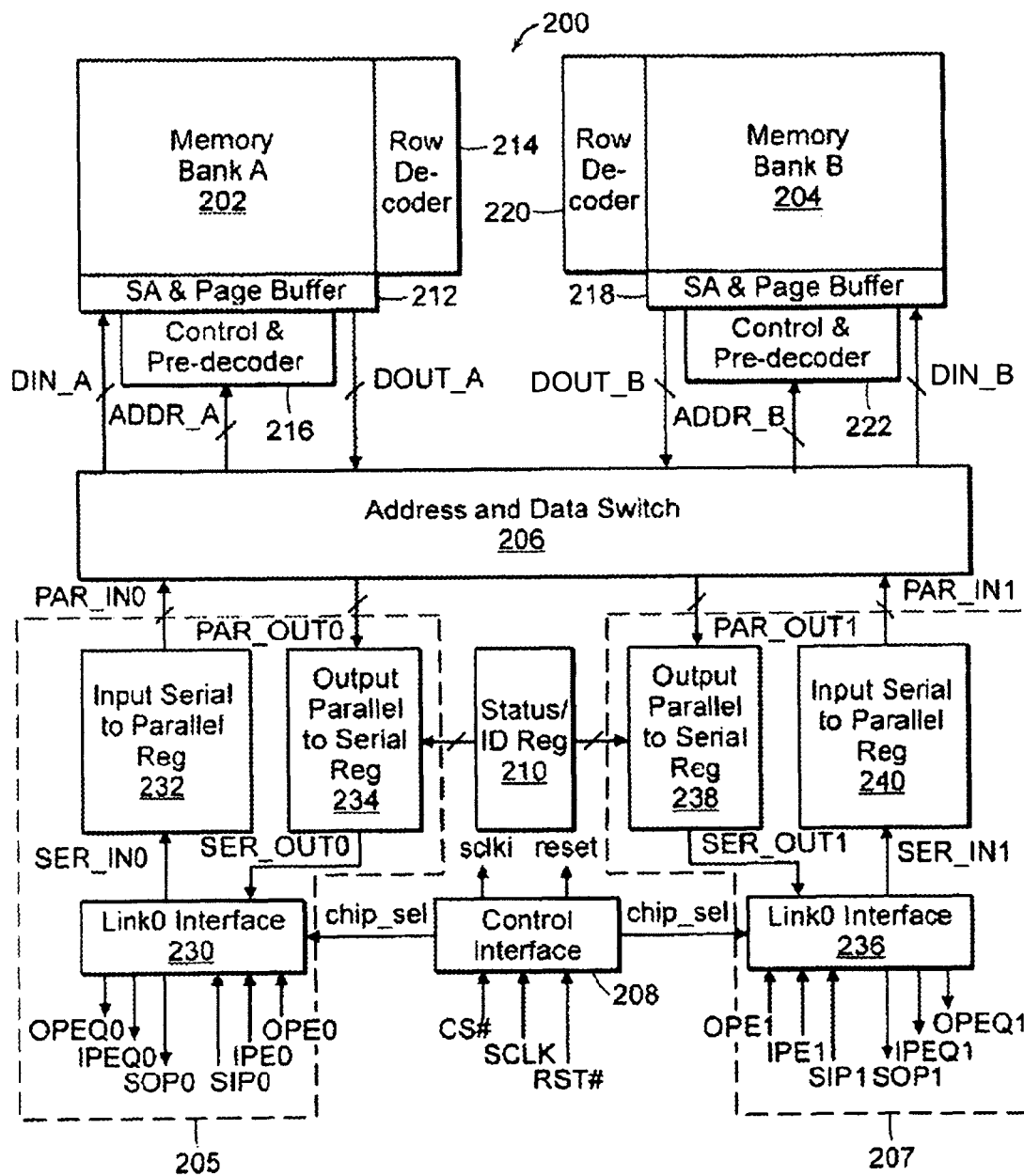
FIG. 2A is a high-level block diagram of an illustrative memory device in accordance with aspects of the invention.

FIG. 2A illustrates a more detailed schematic diagram of the memory device shown in FIG. 1A, according to one embodiment of the present invention. The architecture of each memory bank in the memory device 200 may be the same or similar to a NAND Flash memory core architecture. FIG. 2A illustrates those circuits which are relevant to the invention, and intentionally omits certain circuit blocks to simplify FIG. 2A. For example, memory device 200 implemented with a Flash memory core architecture will include high voltage generator circuits that are necessary for programming and erasing the memory cells. Core architecture (or core circuitry), as used herein, refers to circuitry including memory cell array and associated access circuitry such as decoding and data transfer circuitry. As standard memory architectures are well known, so are the native operations associated with the selected architecture, which should be understood by any person skilled in the art. It should be further understood by those of skill in the art that any known non-volatile or volatile memory architecture can be used in alternative embodiments of the present invention.

Memory device 200 includes a multiplicity of identical memory banks with their respective data, control and addressing circuits, such as memory bank A 202 and memory bank B 204, an address and data path switch circuit 206 connected to both memory banks 202 and 204, and identical interface circuits 205 and 207, associated with each memory bank for providing data to and for receiving data from the switch circuit 206. Memory banks 202 and 204 are preferably non-volatile memory, such as Flash memory, for example. Logically, the signals received and provided by memory bank 202 are designated with the letter "A", while the signals received and provided by memory bank 204 are designated with the letter "B". Similarly, the signals received and provided by interface circuit 205 are designated with the number "0", while the signals received and provided by interface circuit 207 are designated with the number "1". Each interface circuit 205/207 receives access data in a serial data stream, where the access data can include a command, address information and input data for programming operations, for example. In a read operation, the interface circuit will provide output data as a serial data stream in response to a read command and address data. The memory device 200 further includes global circuits, such as a control interface 208 and status/ID register circuit 210, which provide global signals such as clock signal sclki and reset to the circuits of both memory banks 202 and 204 and the respective interface circuits 205 and 207. A further discussion of the aforementioned circuits now follows.

Memory bank 202 includes well known memory peripheral circuits such as sense amplifier and page buffer circuit block 212 for providing output data DOUT_A and for receiving input program data DIN_A, and row decoder block 214. Those of skill in the art will understand that block 212 will also include column decoder circuits. A control and predecoder circuit block 216 receives address signals and control signals via signal line ADDR_A, and provides predecoded address signals to the row decoders 214 and the sense amplifier and page buffer circuit block 212.

The peripheral circuits for memory bank 204 are identical to those previously described for memory bank 202. The circuits of memory bank B include a sense amplifier and page buffer circuit block 218 for providing output data DOUT_B and for receiving input program data DIN_B, a row decoder block 220, and a control and predecoder circuit block 222. Control and predecoder circuit block 222 receives address signals and control signals via signal line ADDR_B, and provides predecoded address signals to the row decoders 220 and the sense amplifier and page buffer circuit block 222. Each memory bank and its corresponding peripheral circuits can be configured with well known architectures.

In general operation, each memory bank is responsive to a specific command and address, and if necessary, input data. For example, memory bank 202 will provide output data DOUT_A in response to a read command and a read address, and can program input data in response to a program command and a program address. Each memory bank can be responsive to other commands such as an erase command, for example.

In the presently shown embodiment, path switch 206 is a dual port circuit which can operate in one of two modes for passing signals between the memory banks 202 and 204, and the interface circuits 205 and 207. First is a direct transfer mode where the signals of memory bank 202 and interface circuit 205 are passed to each other. Concurrently, the signals of memory bank 204 and interface circuit 207 are passed to each other in the direct transfer mode. Second is a cross-transfer mode where the signals of memory bank 202 and interface circuit 207 are passed to each other. At the same time, the signals of memory bank 204 and interface circuit 205 are passed to each other. A single port configuration of path switch 206 will be discussed later.

As previously mentioned, interface circuits 205 and 207 receive and provide data as serial data streams. This is for reducing the pin-out requirements of the chip as well as to increase the overall signal throughput at high operating frequencies. Since the circuits of memory banks 202 and 204 are typically configured for parallel address and data, converting circuits are required.

Interface circuit 205 includes a serial data link 230, input serial to parallel register block 232, and output parallel to serial register block 234. Serial data link 230 receives serial input data SIP0, an input enable signal IPE0 and an output enable signal OPE0, and provides serial output data SOP0, input enable echo signal IPEQ0 and output enable echo signal OPEQ0. Signal SIP0 (and SIP1) is a serial data stream which can each include address, command and input data. Serial data link 230 provides buffered serial input data SER_IN0 corresponding to SIP0 and receives serial output data SER_OUT0 from output parallel to serial register block 234. The input serial-to-parallel register block 232 receives SER_IN0 and converts it into a parallel set of signals PAR_IN0. The output parallel-to-serial register block 234 receives a parallel set of output data PAR_OUT0 and converts it into the serial output data SER_OUT0, which is subsequently provided as data stream SOP0. Output parallel-to-serial register block 234 can also receive data from status/ID register circuit 210 for outputting the data stored therein instead of the PAR_OUT0 data. Further details of this particular feature will be discussed later. Furthermore, serial data link 230 is configured to accommodate daisy chain cascading of the control signals and data signals with another memory device 200.

Serial interface circuit 207 is identically configured to interface circuit 205, and includes a serial data link 236, input serial-to-parallel register block 240, and output parallel-to-serial register block 238. Serial data link 236 receives serial input data SIP1, an input enable signal IPE1 and an output enable signal OPE1, and provides serial output data SOP1, input enable echo signal IPEQ1 and output enable echo signal OPEQ1. Serial data link 236 provides buffered serial input data SER_IN1 corresponding to SIP1 and receives serial output data SER OUT1 from output parallel-to-serial register block 238. The input serial-to-parallel register block 238 receives SER_IN1 and converts it into a parallel set of signals PAR_IN1. The output parallel-to-serial register block 240 receives a parallel set of output data PAR_OU 1 and converts it into the serial output data SER_OUT1, which is subsequently provided as data stream SOP1. Output parallel to serial register block 240 can also receive data from status/ID register circuit 210 for outputting the data stored therein instead of the PAR_OUT1 data. As with serial data link 230, serial data link 236 is configured to accommodate daisy chain cascading of the control signals and data signals with another memory device 200.

Control interface 208 includes standard input buffer circuits, and generates internal chip select signal chip_sel, internal clock signal sclki, and internal reset signal reset, corresponding to CS#, SCLK and RST# respectively. While signal chip_sel is used primarily by serial data links 230 and 236, reset and sclki are used by many of the circuits throughout memory device 200.

Figure 2B:
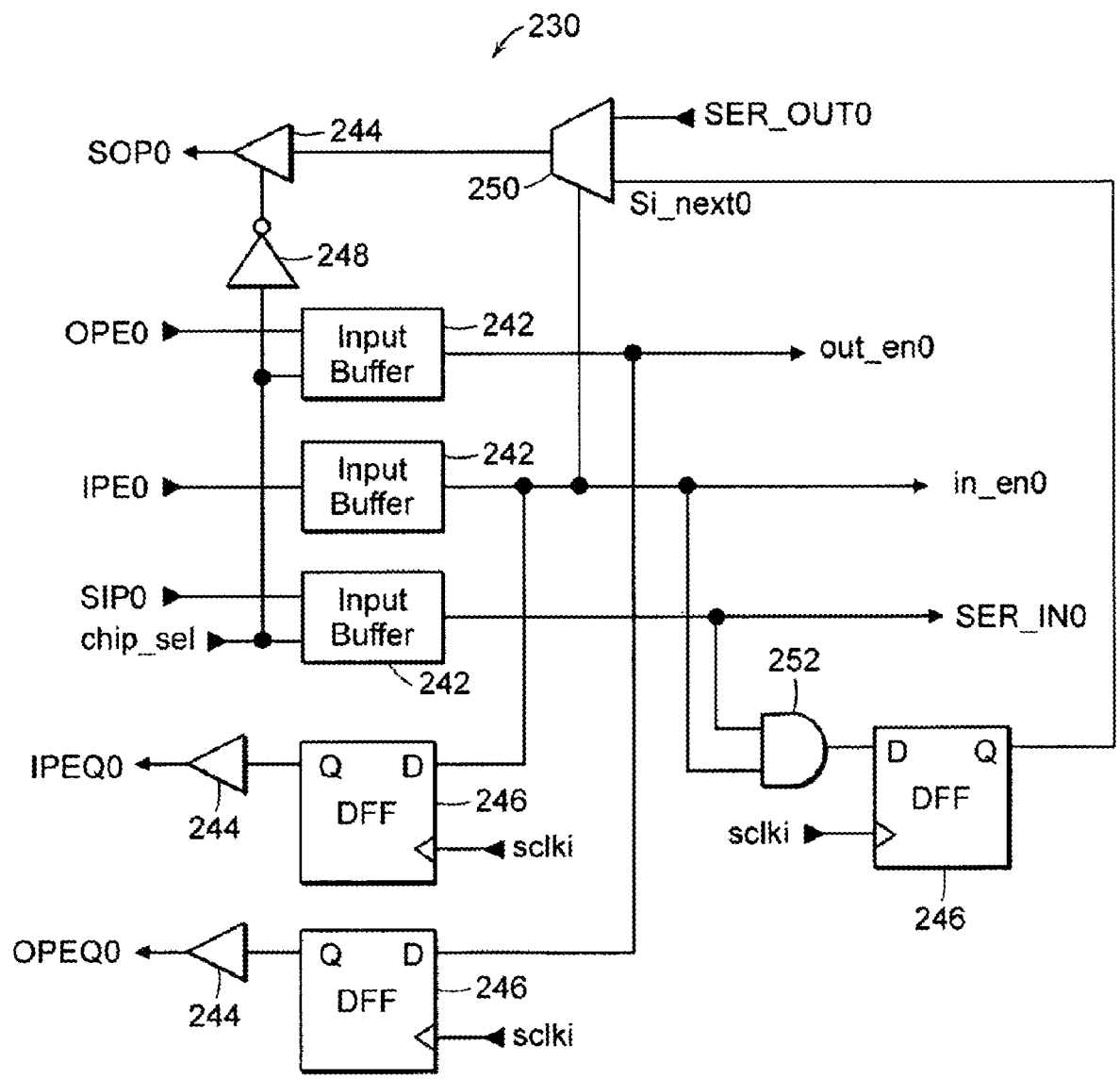
FIG. 2B is a schematic of a serial data link shown in FIG. 2A, according to an embodiment of the present invention.

FIG. 2B is a schematic of serial data link 230, according to an embodiment of the invention. Serial data link 230 includes input buffers 242 for receiving input signals OPE0, IPE0 and SIP0, output drivers 244 for driving signals SOP0, IPEQ0 and OPEQ0, flip-flop circuits 246 for clocking out signals out_en0 and in_en0, inverter 248 and multiplexor (MUX) 250. The input buffers for signals OPE0 and SIP0 are enabled in response to chip_sel, and the output driver for signal SOP0 is enabled in response to an inverted chip_sel via inverter 248. Signal out-en0 enables an output buffer, which is shown later in FIG. 2E and provides signal SER_OUT0. Signal in_en0 enables the input serial to parallel register block 232 to latch SER_IN0 data. Signals in_en0, out-en0 and SER_IN0.

Serial data link 230 includes circuits to enable daisy chain cascading of the memory device 200 with another memory device. More specifically, the serial input data stream SIP0, and enable signals OPE0 and IPE0 can be passed through to the corresponding pins of another memory device through serial data link 230. SER_IN0 is received by AND logic gate 252 and passed to its corresponding flip-flop 246 when in_en0 is at the active high logic level. Simultaneously, in_en0 at the active high logic level will control MUX 250 to pass Si_next0 to output driver 244. Similarly, IPE0 and OPE0 can be clocked out to IPEQ0 and OPEQ0 through respective flip-flops 246. While serial data link 230 has been described, it is noted that serial data link 236 includes the same components, which are interconnected in the same way as shown for serial data link 230 in FIG. 2B.

Figure 2C:
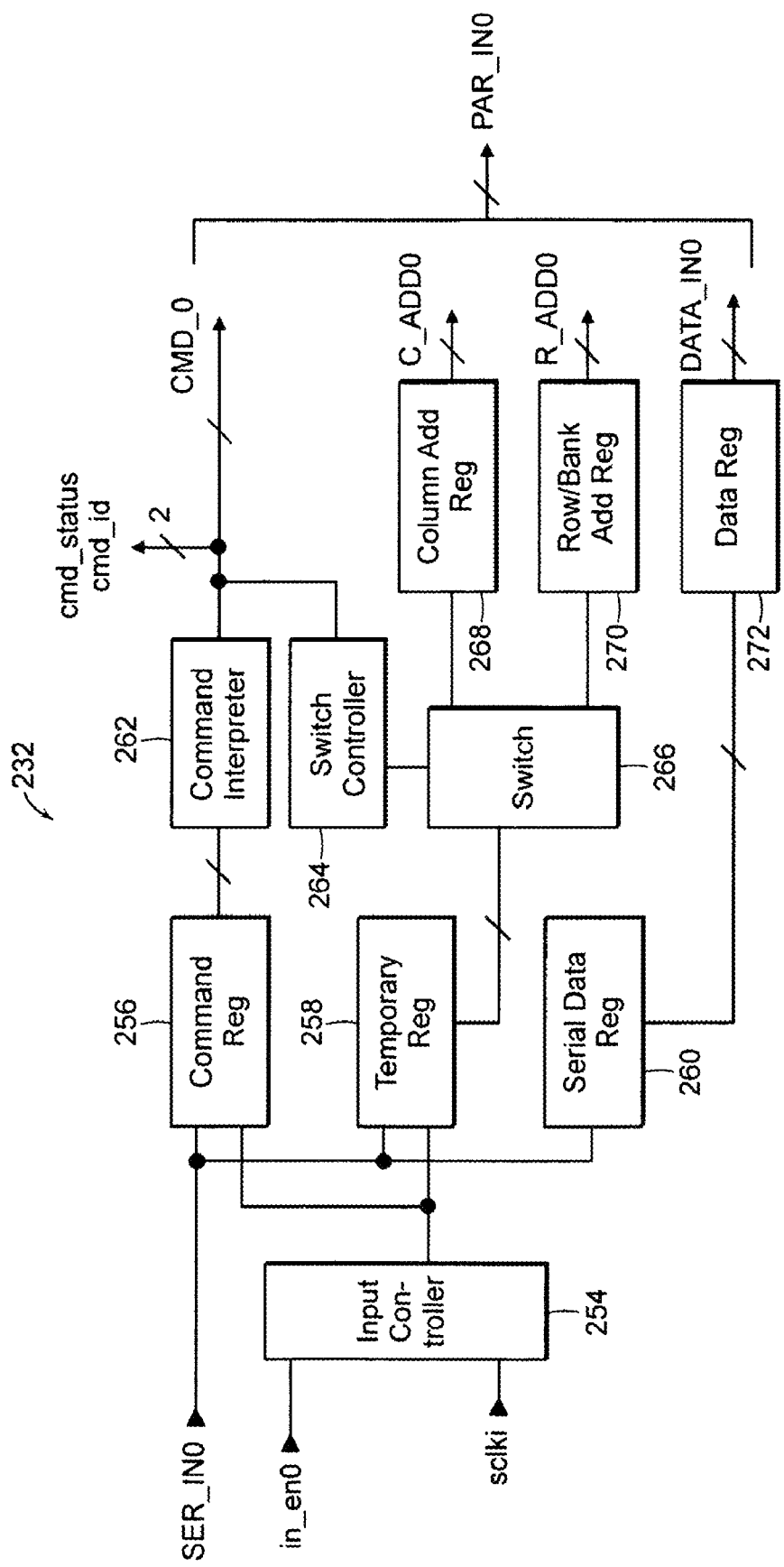
FIG. 2C is a schematic of an input serial to parallel register block shown in FIG. 2A, according to an embodiment of the present invention.

FIG. 2C is a schematic of the input serial to parallel register block 232. This block receives the clock signal sclki, the enable signal in_en0 and the input data stream SER_IN0, and converts SER_IN0 into parallel groups of data. In particular, SER_IN0 can be converted to provide a command CMD_0, a column address C_ADD0, a row address R_ADD0 and input data DATA_IN0. The presently disclosed embodiment of the invention preferably operates at a high frequency, such as at 200 MHz for example. At this speed, the serial input data stream can be received at a rate faster than the received command can be decoded. It is for this reason that the serial input data stream is initially buffered in a set of registers. It should be understood that the presently shown schematic also applies to input serial to parallel register block 240, where the only difference lies in the designator of the signal names.

The input serial-to-parallel register block 232 includes an input controller 254 for receiving in_en0 and sclki, a command register 256, a temporary register 258, and a serial data register 260. Since the data structure of the serial input data stream is predetermined, specific numbers of bits of the input data stream can be distributed to the aforementioned registers. For example, the bits corresponding to a command can be stored in the command register 256, the bits corresponding to row and column addresses can be stored in the temporary register 258, and the bits corresponding to input data can be stored in the serial data register 260. The distribution of the bits of the serial input data stream can be controlled by input controller 254, which van include counters for generating the appropriate register enabling control signals after each predetermined number of bits have been received. In other words, each of the three registers can be sequentially enabled to receive and store bits of data of the serial input data stream in accordance with the predetermined data structure of the serial input data stream.

A command interpreter 262 receives a command signal in parallel from command register 256, and generates a decoded command CMD_0. Command interpreter 262 is a standard circuit implemented with interconnected logic gates or firmware, for decoding the received commands. As shown in FIG. 2C, CMD_0 can include signals cmd_status and cmd_id. A switch controller 264 receives one or more signals from CMD_0 to control a simple switch circuit 266. Switch circuit 266 receives all the data stored in the temporary register 258 in parallel, and loads one or both of column address register 268 and row/bank register 270 with data in accordance with the decoded command CMD_0. This decoding is preferably done because the temporary register may not always include both column and row/bank address data. For example, a serial input data stream having a block erase command will only use a row address, in which case only the relevant bits stored in the temporary register 258 are loaded into row/bank register 270. The column address register 268 provides parallel signal C-ADD0, the row/bank address register 270 provides parallel signal R_ADD0, and data register 272 provides parallel signal DATA_IN0, for programming operations. Collectively, CMD_0, C_ADD0, R_ADD0) and Data_IN0 (optional), form the parallel signal PAR_IN0. Bit widths for each of the parallel signals have not been specified, as the desired width is a design parameter which can be customized, or tailored to adhere to a particular standard.

Examples of some of the operations of the memory device 200 for a Flash core architecture implementation are shown in Table 1 below. Table 1 lists possible OP (operation) codes for CMD_0 and corresponding states of the column address (C_ADD0), row/bank address (R_ADD 0), and the input data (DATA_IN0).

TABLE 1

Command Set

| Operation | OP Code (1 Byte) | Column Address (2 Bytes) | Row/Bank Address (3 Bytes) | Input Data (1 Byte to 2112 Bytes) |
|---|---|---|---|---|
| Page Read | 00h | Valid | Valid | — |
| Random Data Read | 05h | Valid | — | — |
| Page Read for Copy | 35h | — | Valid | — |
| Target Address Input for Copy | 8Fh | — | Valid | — |
| Serial Data Input | 80h | Valid | Valid | Valid |
| Random Data Input | 85h | Valid | — | Valid |
| Page Program | 10h | — | — | — |
| Block Erase | 60h | — | Valid | — |
| Read Status | 70h | — | — | — |
| Read ID | 90h | — | — | — |
| Write Configuration Register | A0h | — | — | Valid (1 Byte) |
| Write DN (Device Name) Entry | B0h | — | — | — |
| Reset | FFh | — | — | — |
| Bank Select | 20h | — | Valid (Bank) | — |

Furthermore, Table 2 shows the preferred input sequence of the input data stream. The commands, addresses, and data are serially shifted in and out of the memory device 200, starting with the most significant bit. Command sequences start with a one-byte command code ("cmd" in Table 2). Depending on the command, the one-byte command code may be followed by column address bytes ("ca" in Table 2), row address bytes ("ra" in Table 2), bank address bytes ("ba" in Table 2), data bytes ("data" in Table 2), and/or a combination or none.

TABLE 2

Input Sequence in Byte Mode

| Operation | $1^{st}$ Byte | $2^{nd}$ Byte | $3^{rd}$ Byte | 4th Byte | $5^{th}$ Byte | $6^{th}$ Byte | $7^{th}$ Byte | $2115^{th}$ ... Byte | $2118^{th}$ ... Byte |
|---|---|---|---|---|---|---|---|---|---|
| Page Read | cmd | ca | Ca | ba/ra | ra | ra | — | — | — |
| Random Data Read | cmd | ca | Ca | — | — | — | — | — | — |
| Page Read for Copy | cmd | ba/ra | Ra | ra | — | — | — | — | — |
| Target Address Input for Copy | cmd | ba/ra | Ra | ra | — | — | — | — | — |
| Serial Data Input | cmd | ca | Ca | ba/ra | ra | ra | data | ... data | ... data |
| Random Data Input | cmd | ca | Ca | data | data | data | data | ... data | — |
| Page Program | cmd | — | — | — | — | — | — | — | — |
| Block Erase | cmd | ba/ra | Ra | ra | — | — | — | — | — |
| Read Status | cmd | — | — | — | — | — | — | — | — |
| Read ID | cmd | — | — | — | — | — | — | — | — |
| Write Configuration | cmd | data | — | — | — | — | — | — | — |

TABLE 2-continued

| | Input Sequence in Byte Mode | | | | | | | | |
|---|---|---|---|---|---|---|---|---|---|
| Operation | 1st Byte | 2nd Byte | 3rd Byte | 4th Byte | 5th Byte | 6th Byte | 7th Byte | 2115th ... Byte | 2118th ... Byte |
| Register | | | | | | | | | |
| Write DN Entry | cmd | — | — | — | — | — | — | — | — |
| Reset | cmd | — | — | — | — | — | — | — | — |
| Bank Select | cmb | ba | — | — | — | — | — | — | — |

Figure 2D:
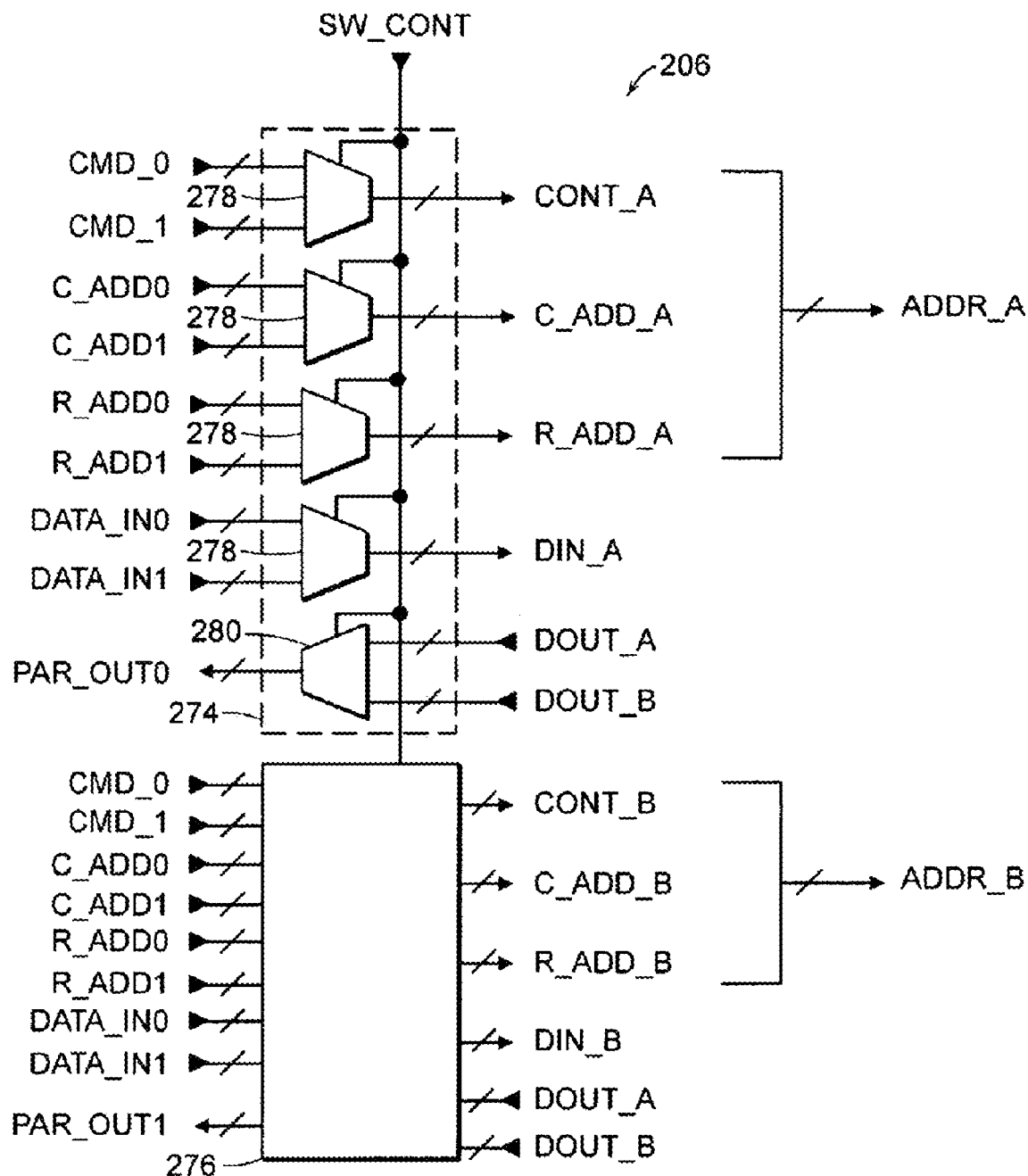
FIG. 2D is a schematic of a path switch circuit shown in FIG. 2A, according to an embodiment of the present invention.

FIG. 2D is a schematic of path switch 206 shown in FIG. 2A. Switch 206 is logically divided into two switch sub-circuits 274 and 276, which are identically configured. Switch sub-circuit 274 includes four input multiplexors 278 that selectively pass the commands, addresses and input data of either interface circuit 205 or interface circuit 207 to the circuits of memory bank 202. These signals have been previously grouped in FIG. 2C as PAR_IN0 by example. Switch sub-circuit 274 includes one output multiplexor 280 for selectively passing the output data from either memory bank 202 or memory bank 204 to interface circuit 205. Switch sub-circuit 276 includes four input multiplexors (not shown) that selectively pass the commands, addresses and input data of either interface circuit 205 or interface circuit 207 to the circuits of memory bank 204. Switch sub-circuit 276 includes one output multiplexor (not shown) for selectively passing the output data from either memory bank 202 or memory bank 204 to interface circuit 207.

Both switch sub-circuits 274 and 276 can simultaneously operate in the direct transfer mode or the cross-transfer mode, depending on the state of switch control signal SW_CONT. Path switch circuit 206 is presently shown in a dual port configuration, meaning that both memory banks 202 and 204 can be simultaneously accessed through either interface circuits 205 and 207.

According to another embodiment of the present invention, as previously illustrated in FIG. 1B, path switch 206 can operate in a single port mode in which only one of interface circuits 205 and 207 is active. This configuration can further reduce the pin-out area requirements of the memory device 200 since the input/output pads associated with the unused interface circuit are no longer required. In the single port configuration, switch sub-circuits 274 and 276 are set to operate in the direct transfer mode only, with the exception of the respective output multiplexors 280 which can remain responsive to the SW_CONT selection signal.

In a single port embodiment where only interface circuit 205 is active, a supplemental path switch (not shown) is included in the input parallel to serial register block 232 (or block 234), for selectively passing the data from the outputs of switch 266 and serial data register 260 to the corresponding column, row/bank and data registers of either input serial to parallel register block 232 or 240. Effectively, the supplemental path switch can be similar to switch 206. Hence, the column, row/bank and data registers of both input serial to parallel register blocks 232 and 240 can be loaded with data for alternate memory bank accesses, or for substantially concurrent accesses.

Figure 2E:
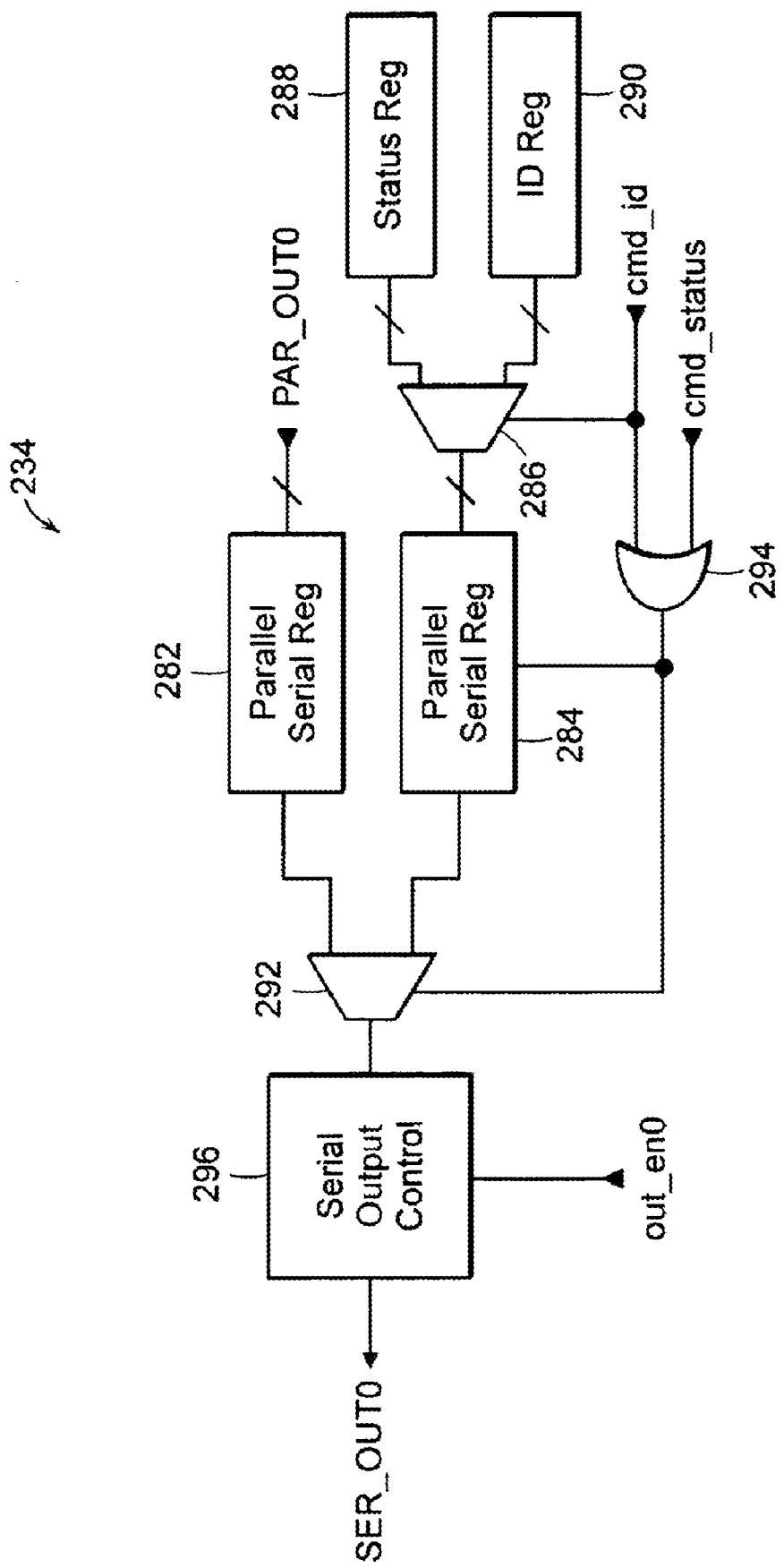
FIG. 2E is a schematic of an output parallel to serial register block shown in FIG. 2A, according to an embodiment of the present invention.

FIG. 2E is a schematic of output parallel-serial register block 234. It is noted that output parallel-to-serial register block 238 is identically configured. Output parallel-to-serial register block 234 provides either data accessed from the memory bank, or status data previously stored in registers. More specifically, the user or system can request a status of either serial data links 230 or 236. A value of '1' in a designated bit location (e.g., bit 4) in the outputted status data can indicate that the particular serial data link interface is busy. The fixed data can further include chip identification data, which with the status data, can both be pre-loaded with default states upon power up of the memory device 200. The status data can be configured to have any preselected bit pattern that is recognizable by the system. Although not shown, FIG. 2E can include additional control circuitry for updating one or more bits stored in register 284, based on one or more predetermined conditions. For example, one or more status bits can be changed based on a count of elapsed clock cycles, or based on a combination of one or more flag signals received from various circuit blocks of memory device 200.

Output parallel to serial register block 234 includes a first parallel-to-serial register 282 for receiving output data PAR_OUT0 from path switch 206, a second parallel-to-serial register 284 for receiving fixed data from a multiplexor 286. Multiplexor 286 selectively passes one of the status data stored in status register 288 or chip identification data stored in ID register 290 in response to signal cmd_id. An output multiplexor 292 passes the data from either the first parallel-to-serial register 282 or the second parallel-to-serial register 284 in response to either cmd_id or cmd_status being active, via OR gate 294. Finally, a serial output control circuit 296 enabled by out-en0 provides SER_OUT0.

One skilled in the art will appreciate that the size and location of the status indicator may be altered in accordance with various aspects of the invention. For example, the serial data link interface status indicator may be jointed with other types of status indicator (e.g., memory bank status indicator) and/or physically located outside the register block (e.g., in the link arbitration module or in the control module 238). In other example, the serial data link interface status indicator is a one-bit register.

Figure 15A:
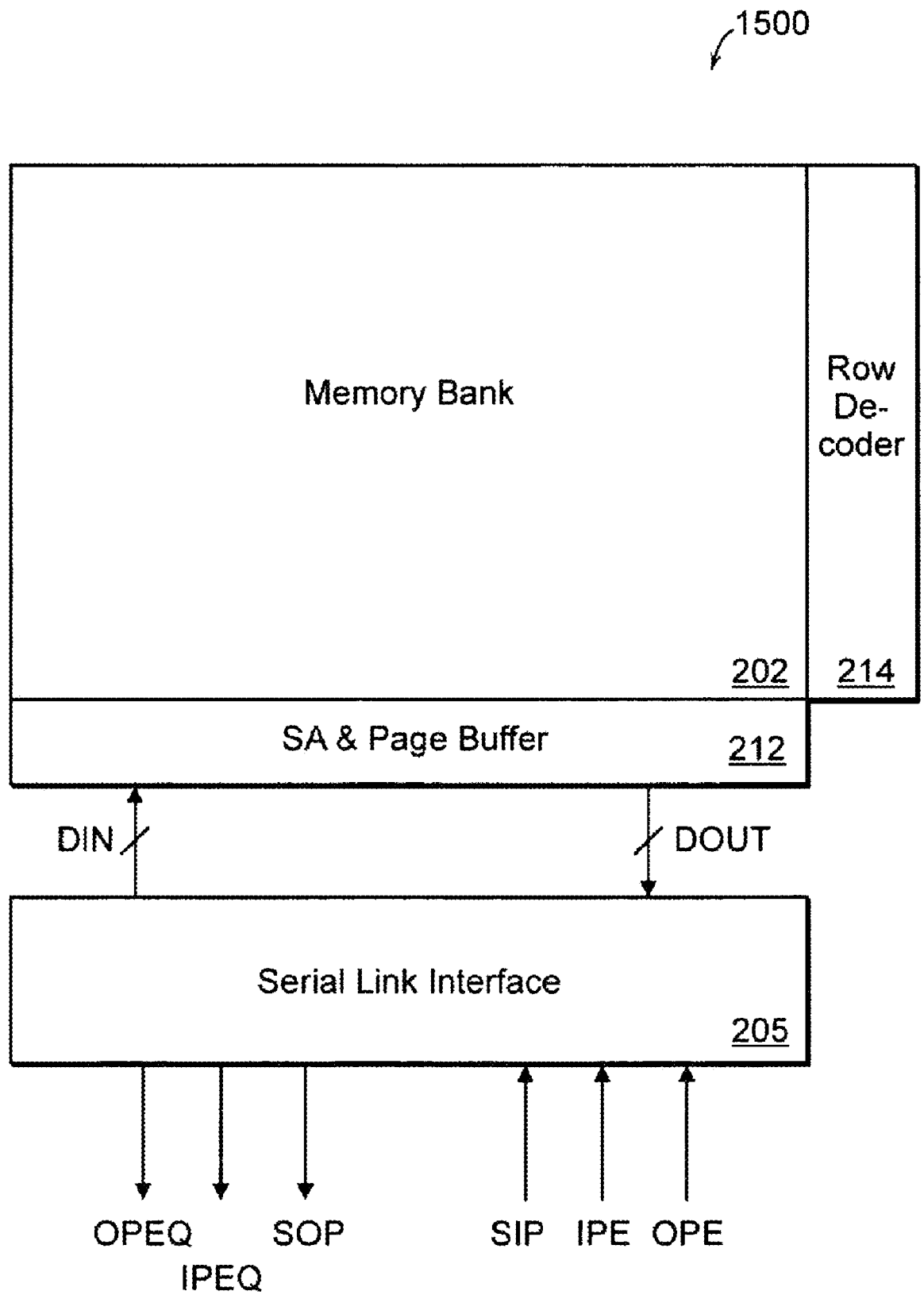
FIG. 15A is a high-level block diagram of an illustrative memory device in accordance with aspects of the invention.

FIG. 15A is a high-level block diagram of an illustrative memory device in accordance with aspects of the invention. The architecture of the memory bank 202 in the memory device 1500 may be the same or similar to a NAND Flash memory core architecture. Certain circuit blocks are omitted to simplify FIG. 15A. For example, memory device 1500 implemented with a Flash memory core architecture will include high voltage generator circuits that are necessary for programming and erasing the memory cells. Core architecture (or core circuitry), as used herein, refers to circuitry including memory cell array and associated access circuitry such as decoding and data transfer circuitry. As standard memory architectures are well known, so are the native operations associated with the selected architecture, which should be understood by any person skilled in the art. It should be further understood by those of skill in the art that any known non-volatile or volatile memory architecture can be used in alternative embodiments of the present invention.

The memory device 1500 includes a memory bank 202, a serial data link interface 205 that transfers serial input data to the memory bank. Memory bank 202 includes well known memory peripheral circuits such as sense amplifier and page buffer circuit block 212 for providing output data DOUT and for receiving input program data DIN, and row decoder block 214. Those of skill in the art will understand that block 212 will also include column decoder circuits. As shown in FIG. 15A, the serial link interface 205 includes a serial input port (SIP), a serial output port (SOP), an input enable control port (IPE), an output enable control port (OPE), an input enable echo control port (IPEQ), and an output enable echo control port (OPEQ). Those of ordinary skill in the art will understand that serial link interface 205 may further include other device ports such as a chip select (CS#) pin, a clock signal input (SCLK), or a reset select (RST#) pin.

Figure 15B:
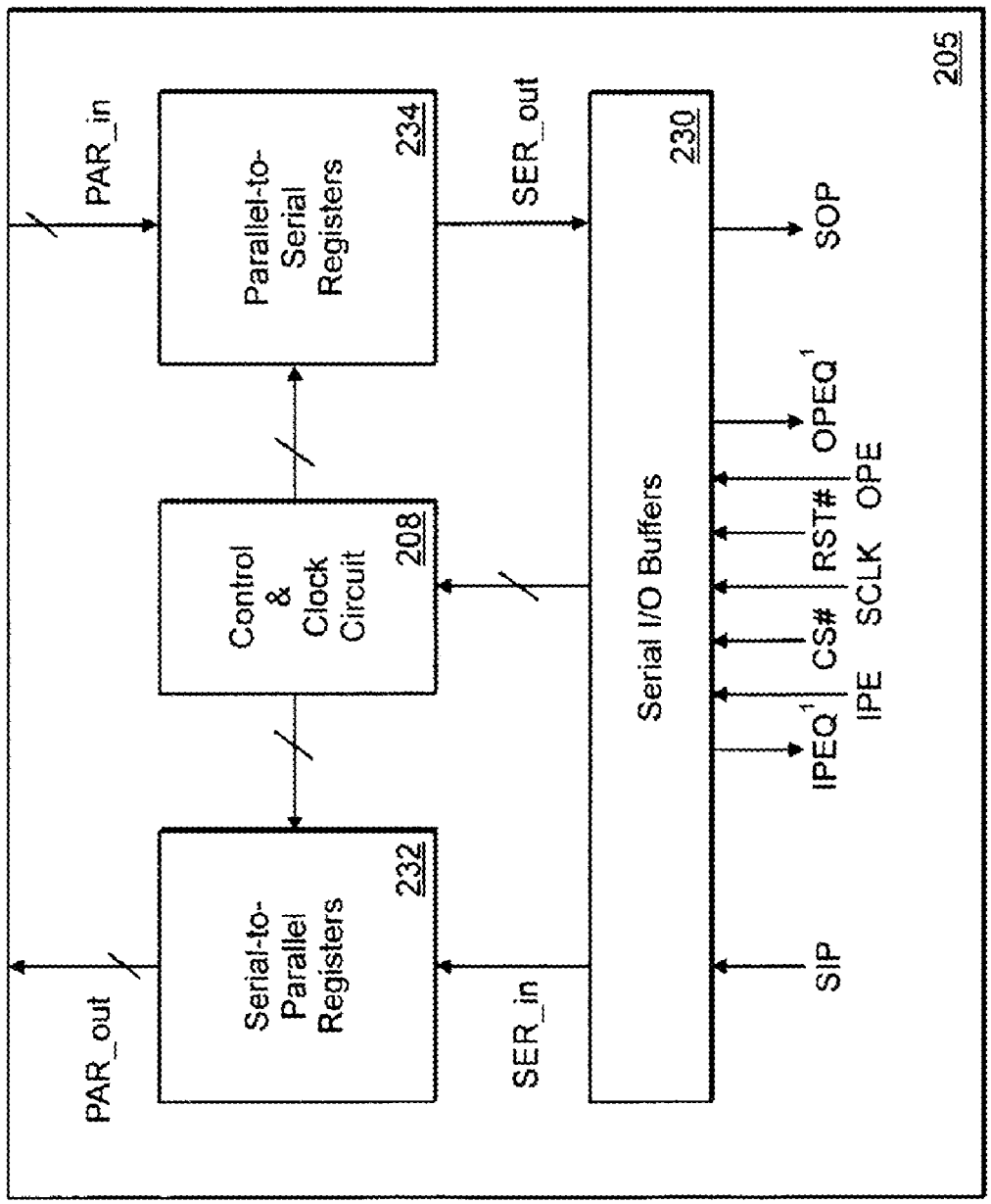
FIG. 15B is a more detailed block diagram of a serial link interface that may be used in the memory device illustrated in FIG. 15A.

FIG. 15B is a more detailed block diagram of a serial link interface that may be used in the memory device illustrated in FIG. 1SA. Similar to the memory device 200 of FIG. 2A, interface circuit 205 includes a serial data link 230, input serial to parallel register block 232, and output parallel to serial register block 234. Serial data link interface 230 receives serial input data SIP, an input enable signal IPE and an output enable signal OPE, and provides serial output data SOP, input enable echo signal IPEQ and output enable echo signal OPEQ. Signal SIP is a serial data stream which can each include address, command and input data. Serial data link 230 provides buffered serial input data SER_in corresponding to SIP and receives serial output data SER_out from the output of parallel-to-serial register block 234. The input of serial-to-parallel register block 232 receives SER_in and converts it into a parallel set of signals PAR_in. The output of parallel-to-serial register block 234 receives a parallel set of output data PAR_in and converts it into the serial output data SER_out, which is subsequently provided as data stream SOP. Furthermore, the input enable signal IPE, an output enable signal OPE, input enable echo signal IPEQ and output enable echo signal OPEQ are used to configure serial data link 230 to accommodate daisy chain cascading of the control signals and data signals with another memory device 1500. A control module 208 controls data transfer between the serial data link interface and the memory bank.

FIGS. 3A, 4, 5A, 6A, and 7 illustrate example timing diagrams for some memory operations performed by memory device 200 in accordance with various aspects of the invention. Some memory commands performed by the memory device 200 include, but are not limited to, page read, random data read, page read for copy, target address input for copy, serial data input, random data input, page program, block erase, read status, read ID, write configuration register, write device name entry, reset, and/or bank select. The following discussion of the timing diagrams is made with reference to the previously described embodiments of the memory device 200 shown in the previous figures, and Tables 1 and 2.

Figure 3A:
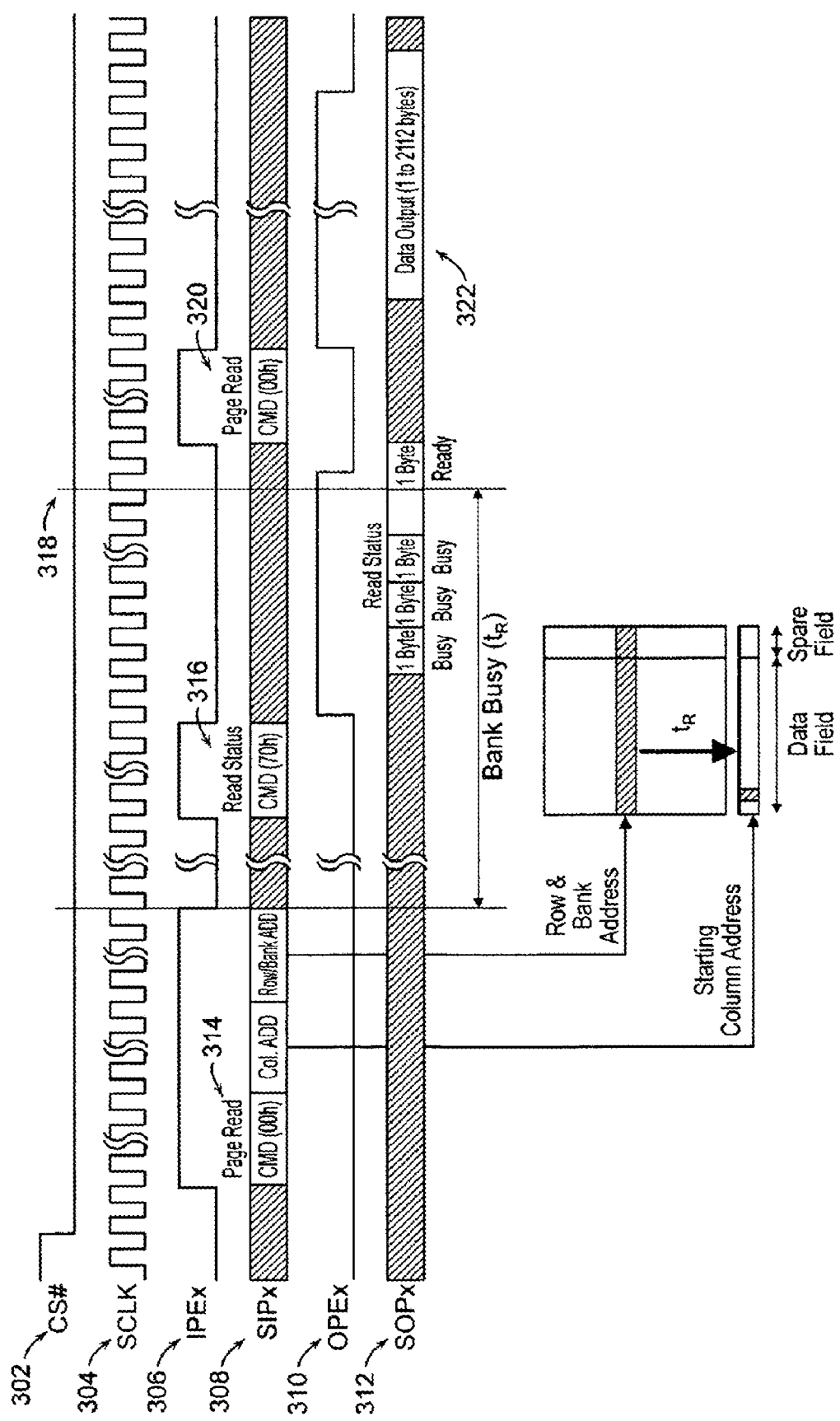
FIGS. 3A, 4, 5A, 6A, and 7 illustrate timing diagrams for memory operations performed by a memory device in accordance with various aspects of the invention.
Figure 3B:
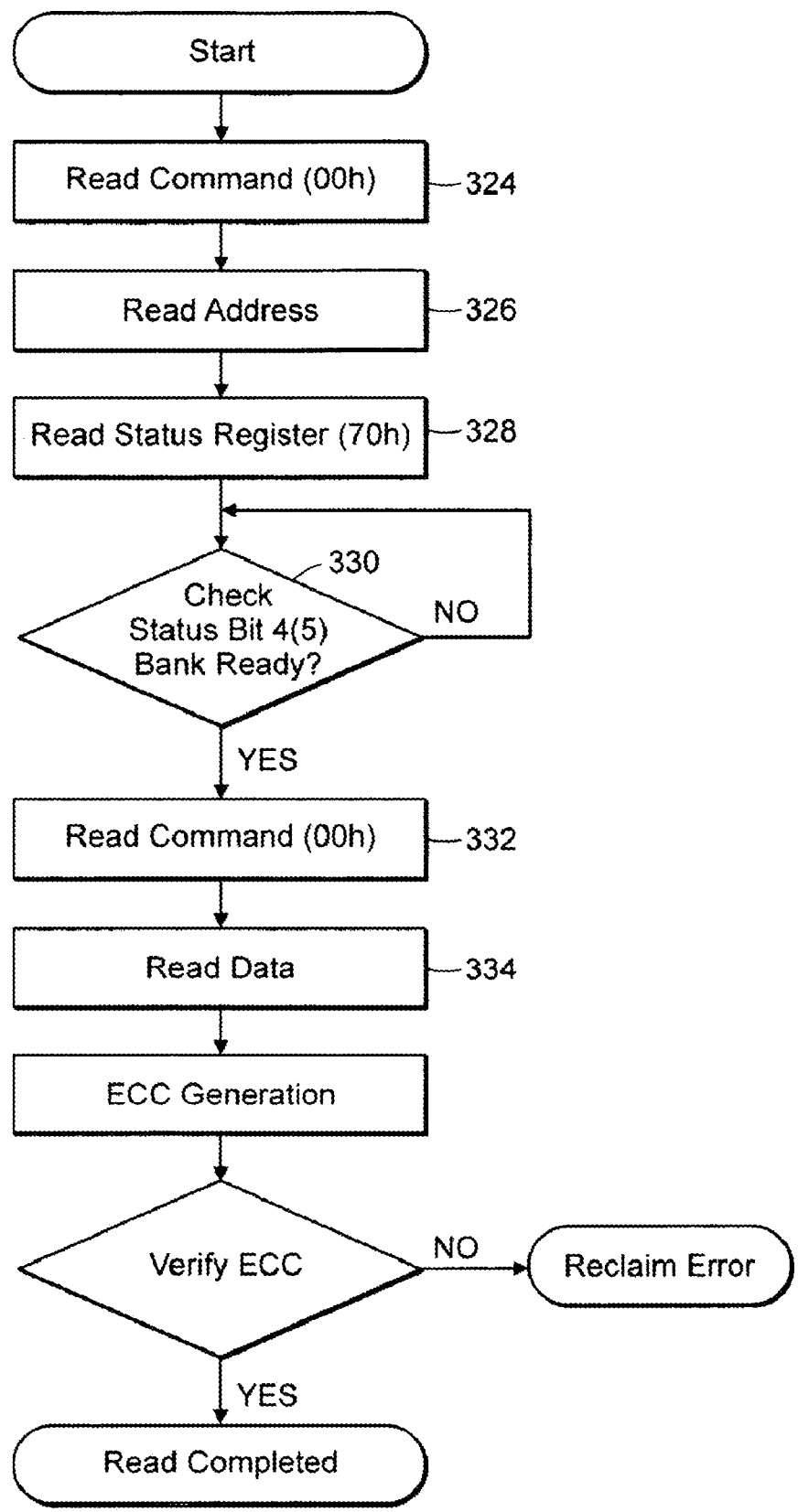
FIGS. 3B, 5B, and 6B are flowcharts illustrating the memory operations of FIGS. 3A, 5A, and 6A, respectively, in a device in accordance with various aspects of the invention.

In the example depicted in the timing diagram of FIG. 3A, a "page read" memory command 314 is received at serial data link 230 of a memory device 200 in accordance with the invention. Moreover, FIG. 3B shows a simplified flowchart paralleling the operation of the "page read" memory command 314 in the timing diagram of FIG. 3A. As a practical matter, the steps illustrated in FIG. 3B will be discussed in conjunction with the timing diagram of FIG. 3A. By way of example, in step 324, a "page read" memory command 314 is read in at serial data link 230 of the memory device 200.

The incoming data stream in this example is a six-byte serial data stream (i.e., serial input data) including command data (in the first byte), column address data (in the second and third bytes), and row and bank address data (in the fourth, fifth, and sixth bytes). As discussed later, with respect to target device addressing, the serial data stream may include an additional byte that identifies a target device address ('tda') and that precedes the command data in the bit stream. The bank address can be used to determine access to either bank 202 or 204 via patch switch 206. One skilled in the art will understand that different memory commands may have a different data stream. For example, a "random data read" memory command has a predetermined data stream of only three bytes: command data (in the first byte) and column address data (in the second and third bytes). In the latter example, the address field of the serial input data only contained column address data and was two bytes long. Meanwhile, in the former example, the address field was five bytes long. One skilled in the art will appreciate after review of the entirety disclosed herein that numerous memory commands and predetermined data steams are apparent in accordance with various aspects of the invention.

Continuing with the example involving the "page read" memory command as illustrated in FIG. 3a, while the chip select (CS#) signal 302 is set low and in response to the input port enable (IPEX) signal 306 set high, the serial input (SIPx) port 308 is sampled on the first rising edge of the serial clock (SCLK) signal 304 (where 'x' acts as a placeholder representing the link interface number, e.g., link 0 interface 232 or link 1 interface 234). The data read out (in step 328) is a data stream corresponding to a "page read" memory command 314. The CS# signal 302 is an input into the memory device 200 and may be used, among other things, to indicate whether the memory device 200 is active (e.g., when CS# is low). The IPEx signal 306 indicates whether an incoming data stream will be received at a particular link interface (e.g., when IPEx is high) or whether a particular link interface will ignore the incoming data stream (e.g., when IPEx is low). The incoming data stream is received at the memory device at the SIPx 308 of a link interface. Finally, the system clock (SCLK) signal 304 is an input into the memory device 200 and is used to synchronize the various operations performed by the numerous circuits of the memory device 200. It will be apparent to one skilled in the art that a memory device in accordance with various aspects of the invention may be synchronized with such a clock signal (e.g., operations and data transfers occur at the rising and/or falling edge of the clock signal) or may be asynchronous (i.e., not synchronous). Alternatively, in a double data rate (DDR) implementation, both the rising and falling edges of the SCLK clock signal may be used to latch information. In the example of FIG. 3A, however, input data is latched on the falling edge of SCLK and output data 322 appears on the serial output pin 312 SOPx after the rising edge of SCLK.

The status of the "page read" can be checked on the SOPx pin 312 as shown in FIG. 3A, whereby a "bank busy" result will be provided on SOPx until a time 318 when a "ready" indication will appear, and the output data will shortly appear during a time 322. It should be noted that although FIG. 3A illustrates a "page read" with subsequent "read status", a "page read" without a "read status" is also contemplated in accordance with aspect of the invention. In that embodiment, no data would be provided on the SOPx pin until output data would be ready.

The command data sampled by SIPx is written to the appropriate register (e.g., command register 256) in FIG. 2C. At least one benefit to the option of designing the incoming data stream such that the first byte is command data is that the data can be transferred to the command register without additional processing. Subsequent bytes in the data stream may be address data and/or input data according to the type of memory command. One skilled in the art will appreciate that the set of memory commands recognized by a memory device in accordance with various aspects of the invention may be defined by word-basis (i.e., 16 bits) or any I/O width. In FIG. 3A, the command data (i.e., 00h corresponding to "page read" 314) is followed by five bytes of address data: two bytes of column address data and three bytes of row/bank address data. The address data is written to an address register 258 in FIG. 2C. The address data is used to locate the data stored in the memory bank 202 that is to be read. The pre-decoder circuit 216, column decoder in circuit 212, and row decoder 214, are utilized during this process to select data to be read. For example, the pre-decoder module 214, is used to pre-decode the address information. Subsequently, the column decoder in circuit 212 and row decoder 214 are used to active the bitline and wordline corresponding to the address data. In the case of a "page read" command, multiple bitlines are activated corresponding to a wordline. Subsequently, the data stored in the memory bank 202 is transferred to a page register in circuit 212 after being sensed by sense amplifiers. The data in the page register may not be available until time 318 in FIG. 3A, i.e. the output pin SOPx will indicate "busy". The amount of time lapsed is referred to as the transfer time (t.sub.R). The transfer time period ends at time 318 (in FIG. 3A) and lasts for a duration of t.sub.R). Before the transfer time period elapses, a memory bank status indicator is set to indicate that the particular memory bank (e.g, memory bank 202) is "busy". The illustrative memory bank status indicator of FIG. 3A is a 1-byte field with one of the bits (e.g., bit 4) indicating whether memory bank 202 (i.e., bank 0) is "busy" or "ready". The memory bank status indicator is stored in a status register 288 of FIG. 2E. The memory bank status indicator is updated (e.g. bit 4 is set to '0') after a memory bank has been identified from the incoming data stream. Once the memory operation is complete, the bank status indicator is updated (e.g., bit 4 is set to '1') to indicate that the memory bank is no longer "busy" (i.e., "ready"). Note that both the bank status indicator as well as the SOPx output pin will indicate the "busy" status as will be explained in further detail below. One of skill in the art will appreciate that although the memory bank status indicator is depicted in FIG. 3A as a 1-byte field, its size is not necessarily so limited. At least one benefit of a larger status indicator is the ability to monitor the status of a greater quantity of memory banks. In addition, the status indicator may be used to monitor other types of status (e.g. whether the memory bank is in a "pass" or "fail" status after a memory operation, such as a "page program", was performed). In addition, it will be apparent to one skilled in the art that the status indicator of this example being implemented such that each bit designates the status of a different memory bank is exemplary only. For example, the value of a combination of bits may be used to indicate the status of a memory bank (e.g., by using logic gates and other circuitry). The operation of the "read status" command corresponding to the memory bank status indicator is discussed in relation to FIG. 7 below.

The memory bank status indicator in the example of FIG. 3A is read using the "read status" memory command 316 (in step 328). Sometime during the transfer time period, a "read status" command 316 is sent to the command register in the register block 224. The "read status" command instructs the memory device 200 to monitor the status of the memory bank 202 to determine when the transfer of data from the memory bank 202 to a page register 216 is complete. The "read status" command is sent from the control module 238 through the data path control module 230 or directly by the data path control module 230. Once the "read status" command has been issued (e.g., sent to a command interpreter 228 and/or control module 238) the output port enable (OPEX) signal 310 is driven high and the contents of the memory bank status indicator are outputted through the serial output (SOPx) port 312. Similar to the IPEx signal 306, the OPEx signal 310 enables the serial output port buffer (e.g., the data output register) when set to high. At time 318 in FIG. 3A, the status indicator data in the SOPx indicates that the memory bank 202 has changed (in step 330) from a "busy" status to a "ready" status. The OPEx signal 310 is returned to low since the content of the status indicator is no longer needed.

Next in FIG. 3A, the IPEx signal is set high, and a "page read" command 320 with no trailing address data is re-issued (in step 332) to the command register in the register block 224 in order to provide data from the data registers to the output pin SOPx. Subsequently, the OPEx signal is set high (and IPEx is returned to low), and the contents of the page register 216 are transferred to the SOPx 312. The output data is provided (in step 334) through the link interface 230 out of memory device 200. Error correction circuitry (not shown in the figures) can check the output data and indicate a read error if an error is detected. Those skilled in the art will understand that the monitoring of the status and reassertion of the page read command can be automatically done by the system. FIG. 3A is merely one example of memory device operation in accordance with aspects of the invention, and the invention is not so limited. For example, other memory commands and timing diagrams are envisioned in accordance with various aspects of the invention.

Figure 4:
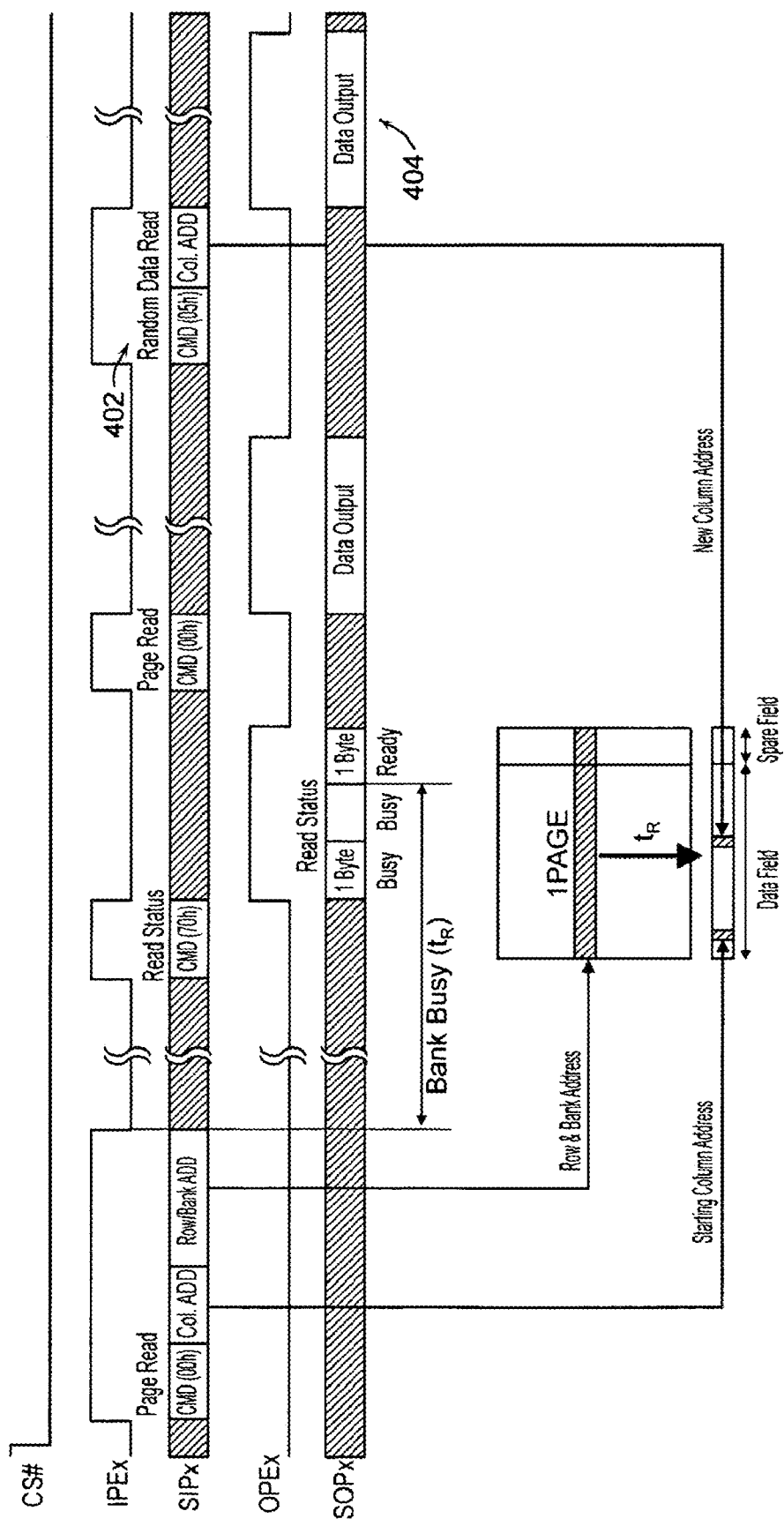

For example, in FIG. 4, a simplified timing diagram for the "random data read" command following a "page read" command is illustrated. The "random data read" command enables the reading of additional data at a single or multiple column addresses subsequent to a "page read" command or a "random data read" command. The data stream for a "random data read" command 402 is comprised of three bytes: command data (in the first byte) and column address data (in the second and third bytes). No row address data is required since data will be read from the same row selected in the "page read" command. A "random data read" command issued after a normal "page read" command has completed results in some of the data 404 from the current page (i.e., the page read during the earlier command) being outputted. At least one benefit to the "random data read" command is the increased efficiency with which data from the preselected page may be outputted since the data is already present in a page register of circuit 212 corresponding to the memory bank 202.

Figure 5A:
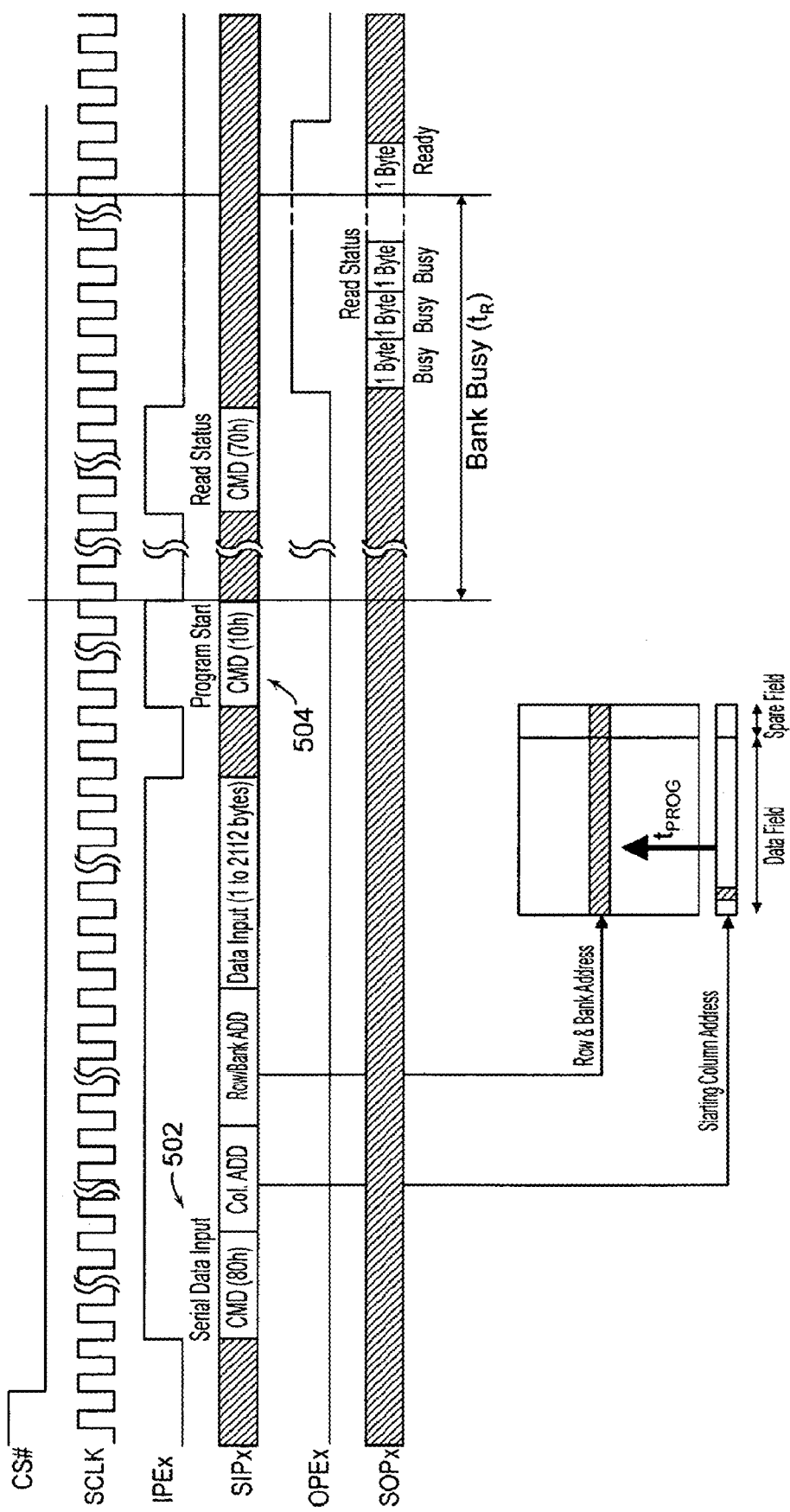

Regarding FIG. 5A, a timing diagram for the "page program" command is illustrated. Since the embodiment illustrated in FIG. 2A utilizes a serial data input and output link structure, prior to beginning to program a page, the program data must first be loaded into a bank page register. This is accomplished with the "serial data input command". The "serial data input" command 502 is comprised of a serial data loading period during which up to a page (e.g., 2,2112 bytes) of data is loaded into the page buffer in circuit 212. After the process of loading the data register is complete, a "page start" command 504 is issued to transfer the data from the bank register into the appropriate memory bank. Once command 504 is issued, the internal write state machine executes an appropriate algorithm and controls timing to program and verify the operation. Therefore, according to an embodiment of the invention, a "page start" command is divided into two steps: serial data input and verification. Upon successful completion of a "page program" command, the memory bank status indicator will provide a "pass" (as opposed to a "fail") result to indicate a successful operation. In other respects, the timing diagram and steps involving in the example of FIG. 5A are similar to those of FIG. 3A, which was previously described in greater detail.

Figure 5B:
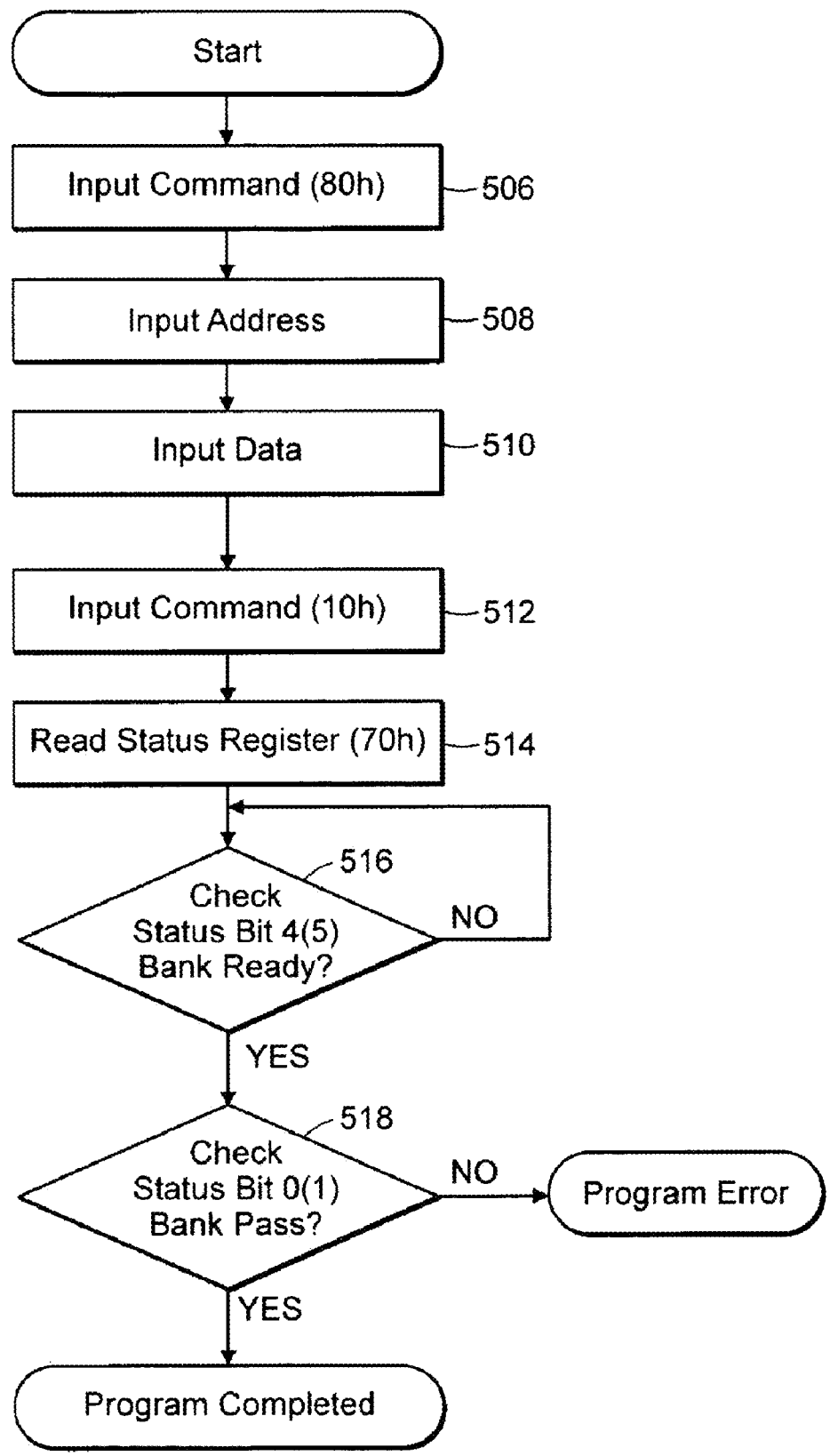

Moreover, FIG. 5B shows a simplified flowchart paralleling the operation of the "page program" command in the timing diagram of FIG. 5A. In step 506, the "serial data input" command 502 is input to the serial input port (SIP) line. The data stream input to the SIP line in this example is a multi-byte serial data stream (i.e., serial input data) beginning with the command data (in the first byte). Next, the column address data (in the second and third bytes of the serial data stream) and row address/bank data (in the fourth, fifth, and sixth bytes of the serial data stream) are input (in step 508) to the SIP line. The, the input data is input (in step 510) to the SIP line in the subsequent bytes of the serial data stream. In step 512, a "program start" command 504 is issued. Next, to monitor the status of the operation, a "read status" command is written to the SIP line (in step 514). This results in the memory device monitoring the status bits of the memory bank status register. Once the status bits indicate that the memory bank is ready (in step 516) and that the memory bank indicates a "pass" (in step 518), then the "page program" memory command has been successfully performed.

In addition, the "page read for copy" and "target address input for copy" memory commands are others operations performed by a memory device in accordance with aspects of the invention. If the "page read for copy" command is written to the command register of the serial link interface, then the internal source address (in 3 bytes) of the memory location is written. Once the source address is inputted, the memory device transfers the contents of the memory bank at the specified source address into a data register. Subsequently, the "target address input for copy" memory command (with a 3-byte bank/row address sequence) is used to specify a target memory address for the page copy operation. A "page program" command may then be used to cause the internal control logic to automatically write the page data to the target address. A "read status" command can be subsequently used to confirm the successful execution of the command. Other memory operations will be apparent to one skilled in the art after review of the entire disclosure herein.

Figure 6A:
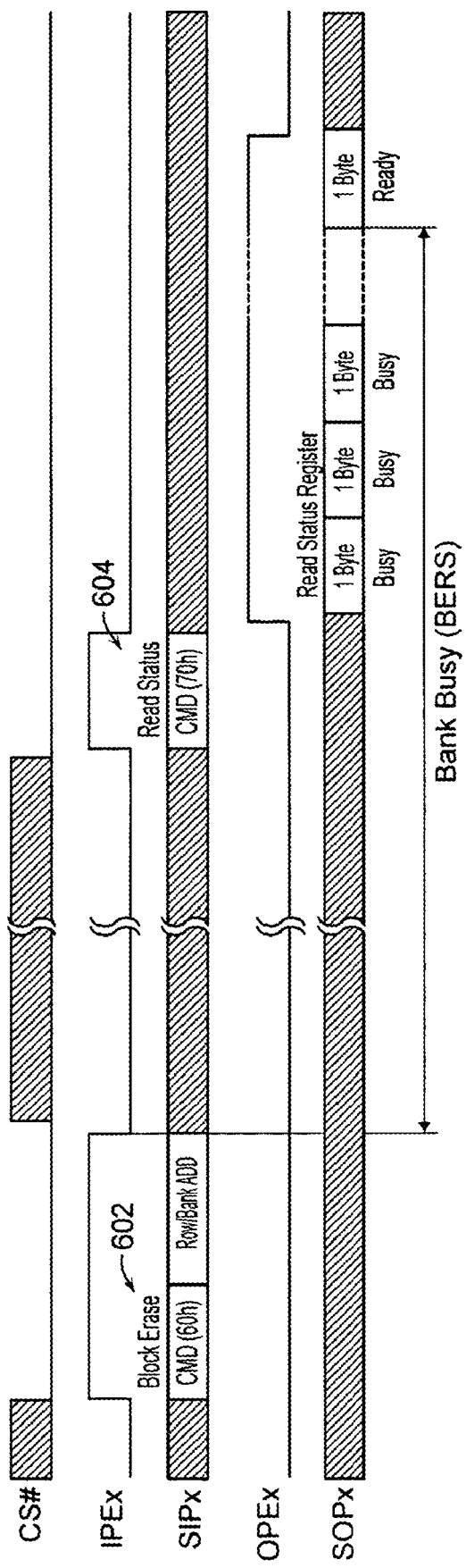
Figure 6B:
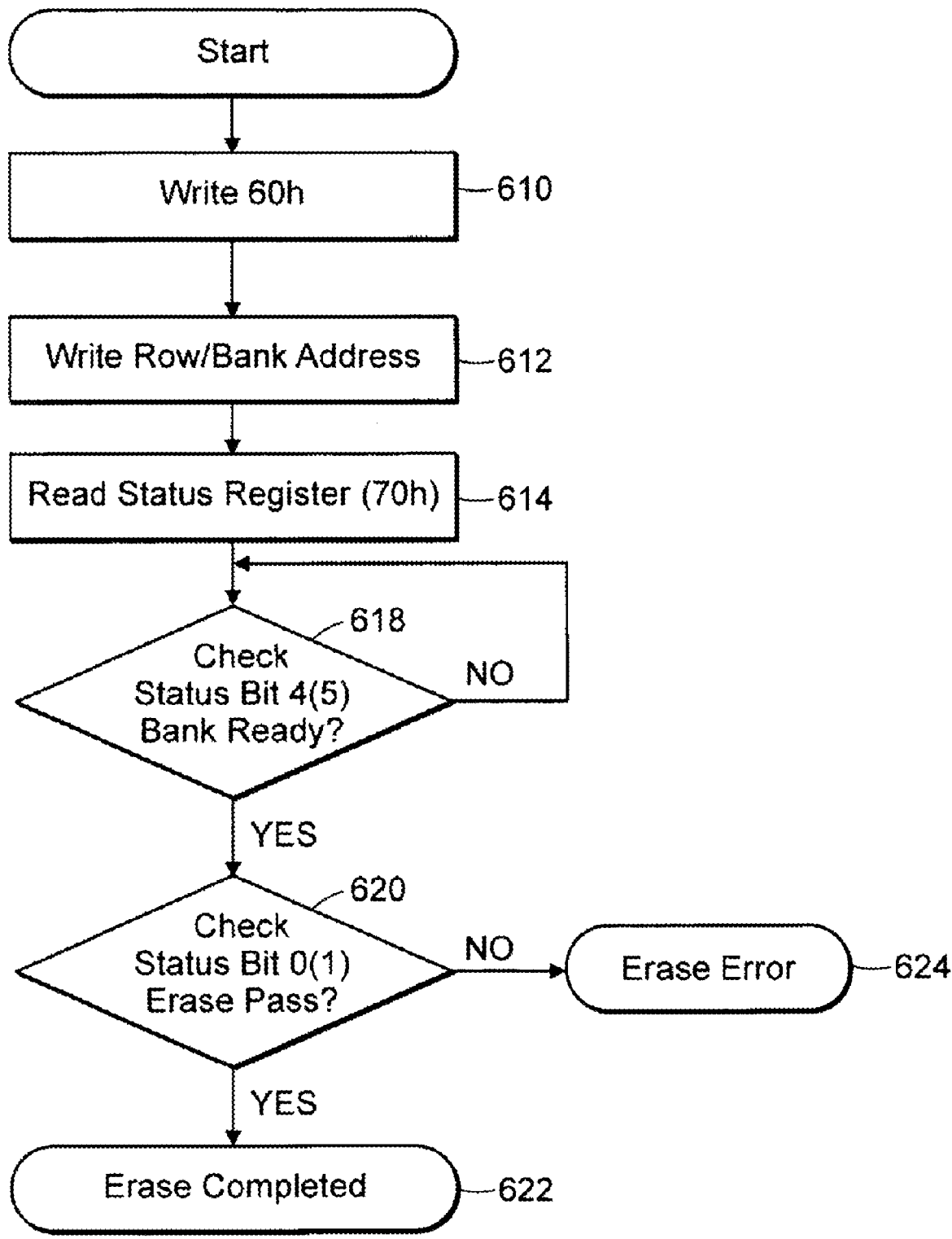

Regarding FIG. 6A, a timing diagram for the "erase" (or "block erase") command is illustrated. In addition, FIG. 6B shows a simplified flowchart paralleling the operation of the "erase" command in the timing diagram of FIG. 6A. One skilled in the art is aware that erasing typically occurs at the block level. For example, a Flash memory device 200 can have, at each bank, 2,048 erasable blocks organized as 64 2,112-byte (2,048+64 bytes) pages per block. Each block is 132K bytes (128K+4K bytes). The "erase" command operates on one block at a time. Block erasing is started by writing command data 602 at step 610 corresponding to the "erase" command (i.e., command data of '60h') to the command register via SIPx along with three bytes for row and bank addresses at step 612. After the command and address input are completed, the internal erase state machine automatically executes the property algorithm and controls all the necessary timing to erase and verify the operation. Note that the "erase" operation may be executed by writing or programming a logic value of '1' to every memory location in a block of memory. In order to monitor the erase status to determine when the tBERS (i.e., block erase time) is completed, the "read status" command 604 (e.g., command data corresponding 70 h) may be issued at step 614. After a "read status" command, all read cycles will be from the memory bank status register until a new command is given. In this example, the appropriate bit (e.g., bit 4) of the memory bank status register reflects the state (e.g., busy or ready) of the corresponding memory bank. When the bank becomes ready at step 618, the appropriate bit (e.g., bit 0 of the memory bank status register is checked at step 620 to determine if the erase operation passed (i.e., successfully performed) at step 622 or failed at step 624. In some respects, the timing diagram and steps involving in the example of FIG. 6A are similar to those of FIG. 3A, which was previously described in greater detail.

Figure 7:
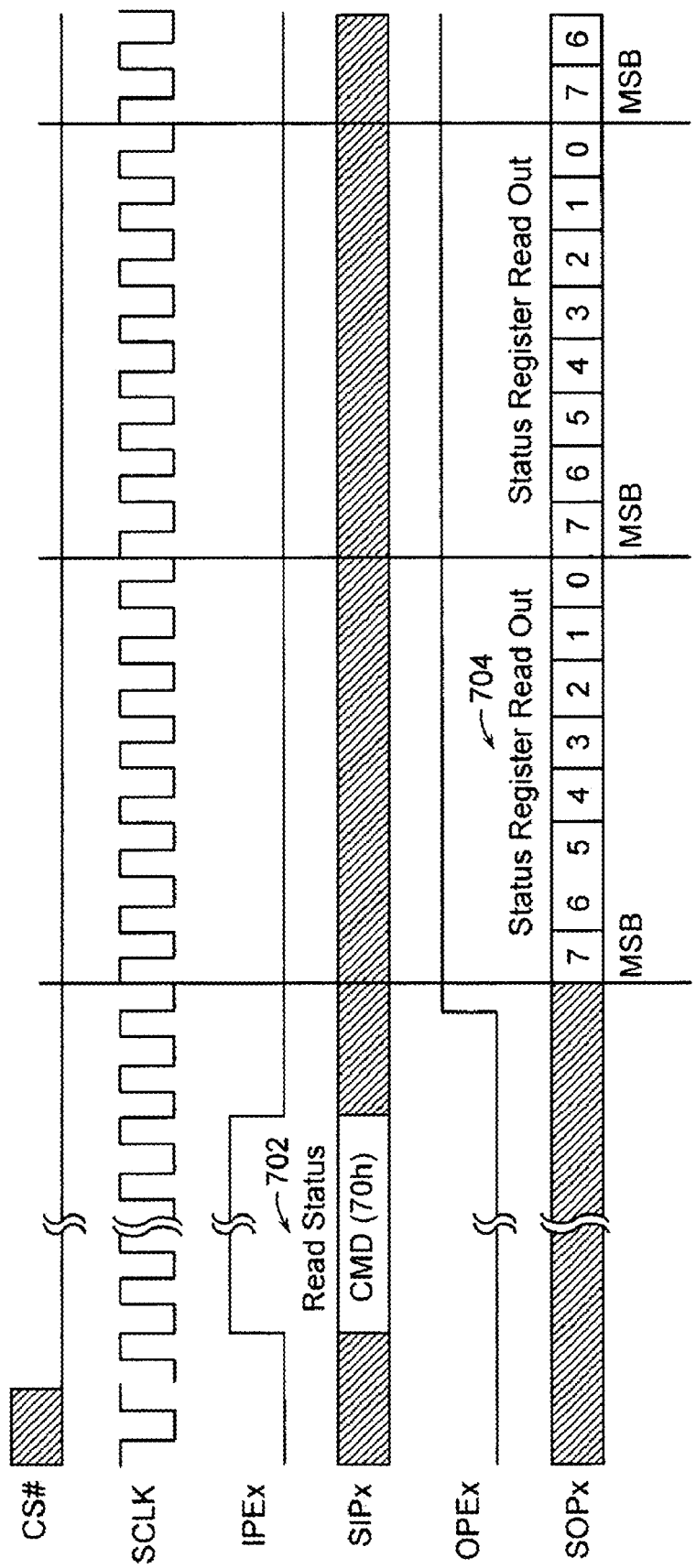

Regarding FIG. 7, the memory bank status indicator is read using the "read status" memory command. When a "read status" command (i.e., '70h') is sent at 702 to the command register 256 in FIG. 2C, the memory device 200 is instructed to monitor the status of the memory bank 202 to, among other things, determine when the transfer of data from the memory bank 202 to the page buffer in circuit 212 is successfully completed. Once the "read status" command has been issued (e.g., sent to a command interpreter 262) the output port enable (OPEX) signal is driven high and the contents of the memory bank status indicator are outputted at 704 through the serial output (SOPx) port. The OPEx signal enables the serial output port buffer (e.g., the data output register) when set to high. In the example of FIG. 7, the memory bank status indicator is a 1-byte (i.e., 8-bit) field with each bit indicating, among other things, whether a memory bank (e.g., memory bank 202) is "busy" or "ready" and/or whether a operation performed on a memory bank (e.g., "erase" command) is has "passed" or "failed". One of skill in the art will appreciate that although the memory bank status indicator is depicted in FIG. 7 as a 1-byte field, its size is not necessarily so limited. At least one benefit of a larger status indicator is the ability to monitor the status of a greater quantity of memory banks. In addition, it will be apparent to one skilled in the art that although the status indicator of this example was implemented such that each bit designated the status of a different memory bank, the invention is not so limited. For example, the value of a combination of bits may be used to indicate the status of a memory bank (e.g., by using logic gates and other circuitry).

Figure 8A:
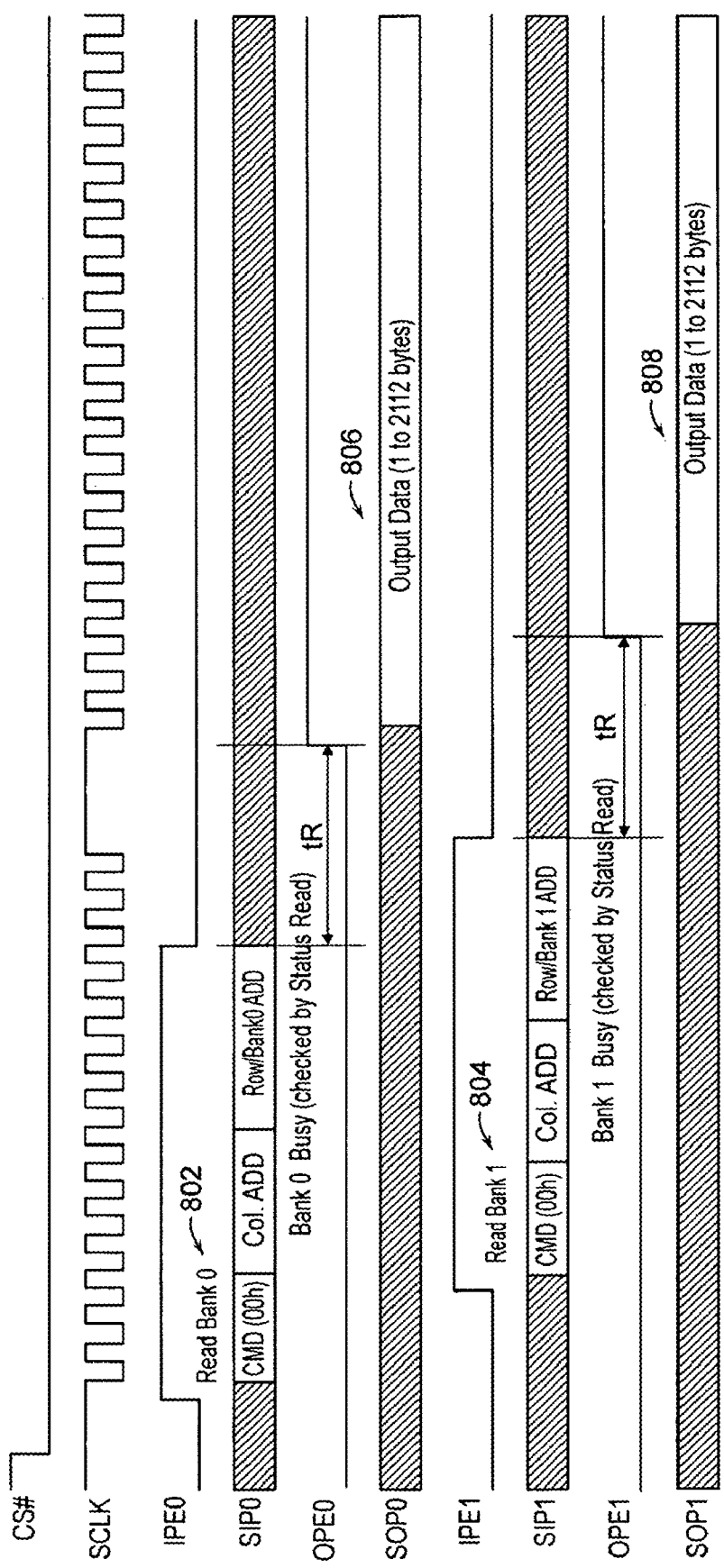
FIGS. 8A, 8B, and 8C illustrate timing diagrams for concurrent memory operations performed in a memory device in accordance with various aspects of the invention.
Figure 8B:
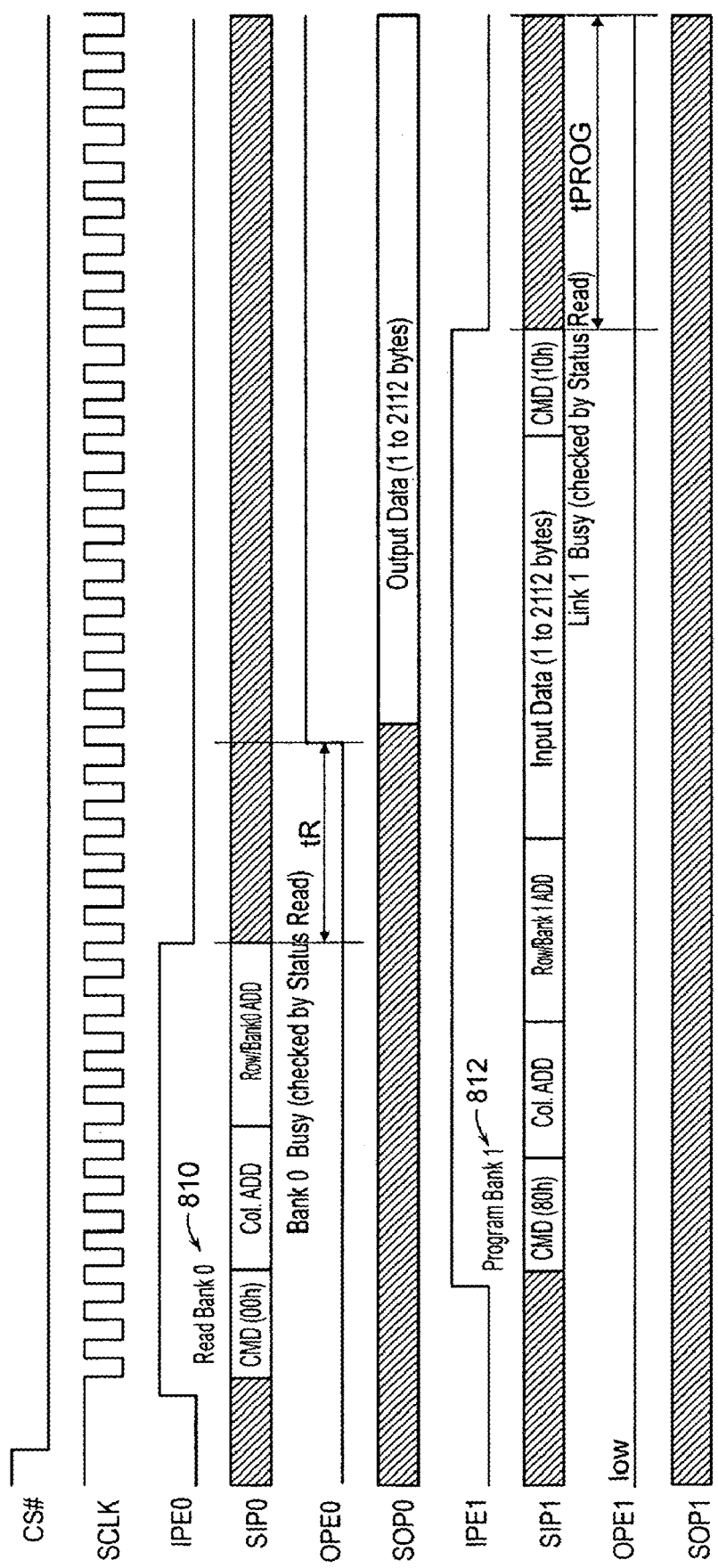
Figure 8C:
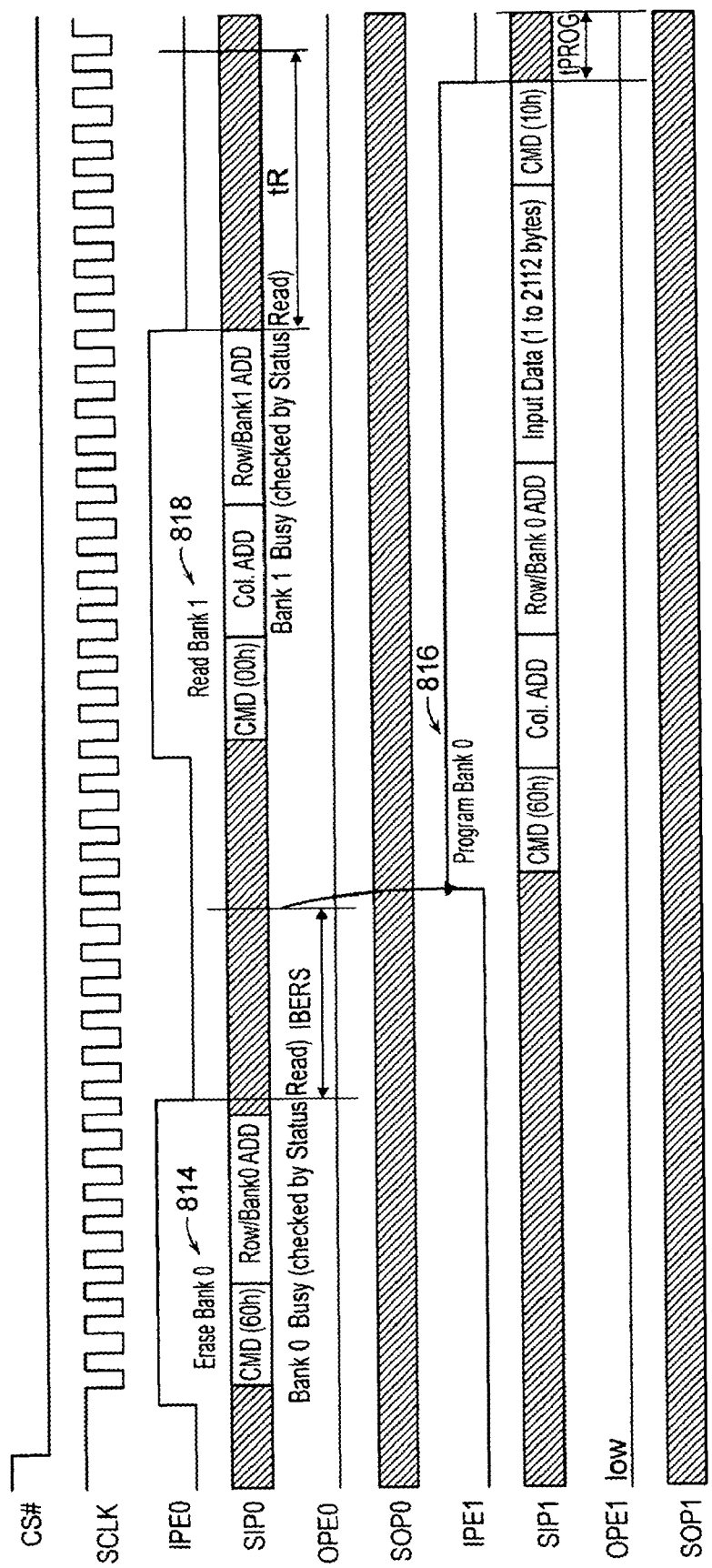

FIGS. 8A, 8B, and 8C illustrate timing diagrams for a memory device in accordance with aspects of the invention being used to perform concurrent operations using dual independent serial data links 230 and 236. Some concurrent operations performed by a memory device in accordance with aspects of the invention include, but are not limited to, concurrent read, concurrent program, concurrent erase, read while program, read while erase, and program while erase. FIG. 8A illustrates a concurrent "page read" operation being performed on bank A (bank 202) and bank B (bank 204). In FIG. 8A, bank A is represented as "bank 0" while bank B is represented as "bank 1". FIG. 8B. Other concurrent operations will become apparent to one skilled in the art upon review of the entire disclosure herein.

Referring to FIG. 8A, concurrent "page read" operations 802, 804 directed at different memory banks in a memory device 200 are executed. In a memory device 200 with dual data link interfaces 230, 236 a "page read" command 804 is issued through data link interface 236 (i.e., link 1) while a "page read" 802 is pending through data link interface 230 (i.e., link 0). Although FIG. 8A shows the "page read" on bank 0 starting before the "page read" on bank 1, the two "page read" operations can begin substantially simultaneously and operate concurrently. The outputted data 806, 808 from each of the "page read" commands is simultaneously sent through their respective data link interfaces. Therefore, each data link interface in memory device 200 may access any of the memory banks and operate independently. At least one benefit of this feature is greater flexibility in system design and an enhancement on device utilization (e.g. bus utilization and core utilization).

The path of the outputted data from the memory bank to the data link interface in FIG. 8A is similar to that of FIG. 3A discussed earlier. For example, the outputted data from memory bank 204 flows from S/A and page buffer 218 through path switch 206 controlled by a bank address for example, to output parallel-to-serial register block 240, and to serial data link interface 236 (i.e., link 1). The simultaneous data transfer between memory banks 202 and 204 and serial data link interfaces 230, 236, respectively, will occur independently of each other. As the bank address can control path switch 206, serial data link interface 236 can access bank 202 instead. The number of data link interfaces in memory device 200 is not limited to the number of ports or pins on memory device 200. Nor is the number of link interfaces in memory device 200 limited by the number of memory banks in the memory device. For example, each data link interface may process a single input stream and/or a single output stream.

Furthermore, in accordance with various aspects of the invention, FIG. 8B illustrates a timing diagram of a "page read" command 810 and a "page program" command 812 directed at different memory banks in a memory device 200 being performed concurrently. In this example, a read operation ("page read" 810) is being performed in one of the plurality of memory banks (e.g., memory bank 202) through serial data link interface 230. Meanwhile, simultaneously, a write operation ("page program" 812) is being performed in another of the plurality of memory banks (e.g. memory bank 204) through serial data link interface 236. In accordance with various aspects of the invention, each link in the memory device 200 may access any of the memory banks and operate independently.

FIG. 8C is an illustrative timing diagram of a memory device 200 with two serial data link interfaces and two memory banks performing concurrent memory operations. First, an "erase" command 814 directed at memory bank 0 (bank 202) is issued from serial interface link 0 (serial data link 230). While link 0 (serial data link 230) and memory bank 0 (bank 202) are busy with the "erase" command 814, a "page program" command is received at the memory device and directed to use link 1 (serial data link 236). Thus, a "page program" command 816 is performed on memory bank 0 (bank 202) from serial data link interface 1 (serial data link 236). Meanwhile, simultaneously, a read command 818 is performed on memory bank 1 (bank 204) by serial data interface 0 (serial data link 230). Data is transferred between serial data link interface 0 (serial data link 230) and bank 0 (bank 202) during memory command 814 and between the same link interface 0 (serial data link 230) and bank I (bank 204) during memory command 818. Therefore, in accordance with aspects of the invention, each link in the memory device 200 independently accesses any of the memory banks (i.e., memory banks that are not busy).

It will be apparent to one skilled in the art, after review of the entirety disclosed herein, that FIGS. 8A, 8B, and 8C illustrate merely some examples of concurrent memory operations envisioned in accordance with the invention. Other examples of concurrent operations include, but are not limited to, concurrent erase, read while program, read while erase, program while erase, erase while program, and/or concurrent program. One skilled in the art will recognize that the depiction of the order of the steps in the flowchart should not be construed to limit the steps to only that particular order. For example, read and program commands can be issued with or without read status commands.

Figure 9:
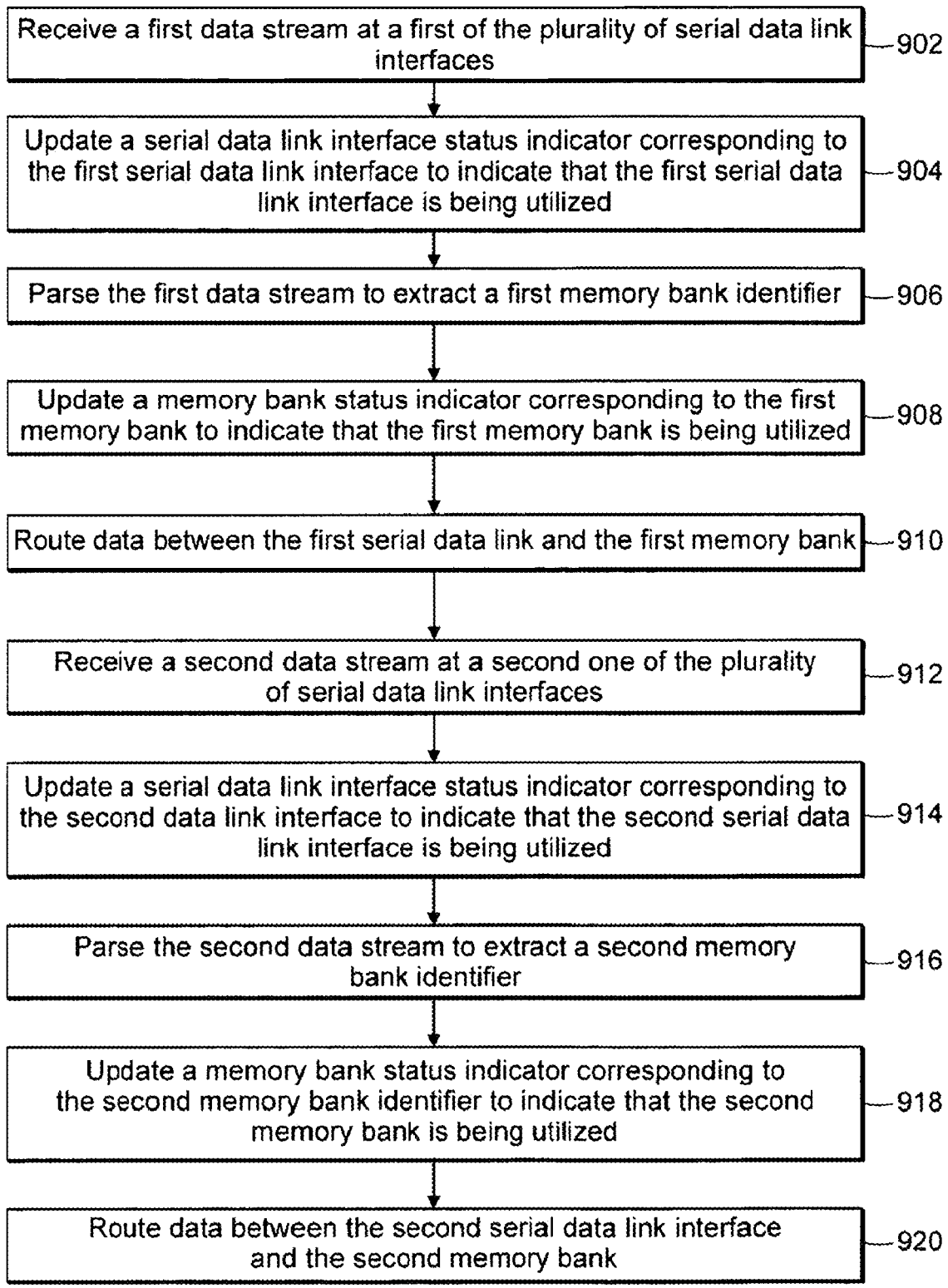
FIGS. 9 and 10 are flowcharts diagramming a method of controlling data transfer between a plurality of serial data link interfaces and a plurality of memory banks in accordance with various aspects of the invention.

FIG. 9 shows a more general description of two concurrent write operations between a plurality of serial link interfaces and a plurality of memory banks in accordance with aspects of the invention. FIG. 9 illustrates a method of writing data via a serial data link interface to a memory bank in accordance with an embodiment of the invention. First, in step 902 a data stream is received at a serial data link interface. The data stream contains command, address and data that will be stored in registers. Next, in step 904 a serial data link interface status indicator corresponding to the first serial data link interface is updated to indicate that the first serial data link interface is being utilized. Step 904 includes changing a bit value in the status register. The update in step 904 indicates that the particular interface is being utilized. In step 906, the data stream is parsed to extract a first memory bank identifier. The memory bank identifier uniquely identifies a memory bank in the memory device. The memory bank identifier may be included within an address field or other field of the data stream. Next, after parsing the data stream to extract a memory bank identifier, in step 908 a corresponding memory bank status indicator is updated. The updating occurring in steps 904 and 908 can be driven by control signals generated by control circuits within status/ID register 210 for example. These control signals have been omitted from the included timing diagrams for simplicity. Finally, in step 910 the data is routed between the first serial data link and the first memory bank. It should be noted that step 910 has been simplified in this general description, since data is first written to a memory bank page register and then subsequently programmed into the memory bank.

Meanwhile, another write data operation is performed on a different memory bank via a different serial data link interface concurrently with the operation 902 shown. In other words, a second memory operation is concurrently performed using a second data stream that is routed between a second serial data link interface and a second memory bank. First a second data stream is received at a second one of the plurality of serial data link interfaces in step 912. The serial data link interfaces referred to in steps 912 and 902 are all part of the same memory device. In step 914 a serial data link interface status indicator corresponding to the second data link interface is updated to indicate that the second serial data link interface is being utilized. Next, the second data stream is parsed to extract a second memory bank identifier in step 916. A memory bank status indicator corresponding to the second memory bank identifier is updated to indicate that the second memory bank is being utilized in step 918 and in step 920 data is routed between the second serial data link interface and the second memory bank via the second memory bank's associated page register, as previously described in relation to the "page program" command. In FIG. 9, once the transfer of data has taken place, i.e., the serial data link interface has received all the data to be written into the designated memory bank, the serial data link interface indicator corresponding to each serial data link interface will be reset to indicate that the associated link is now available, while the memory bank indicator will remain busy until all associated data has been programmed, after which the memory bank indicator will indicate that the associated bank has become available.

Figure 10:
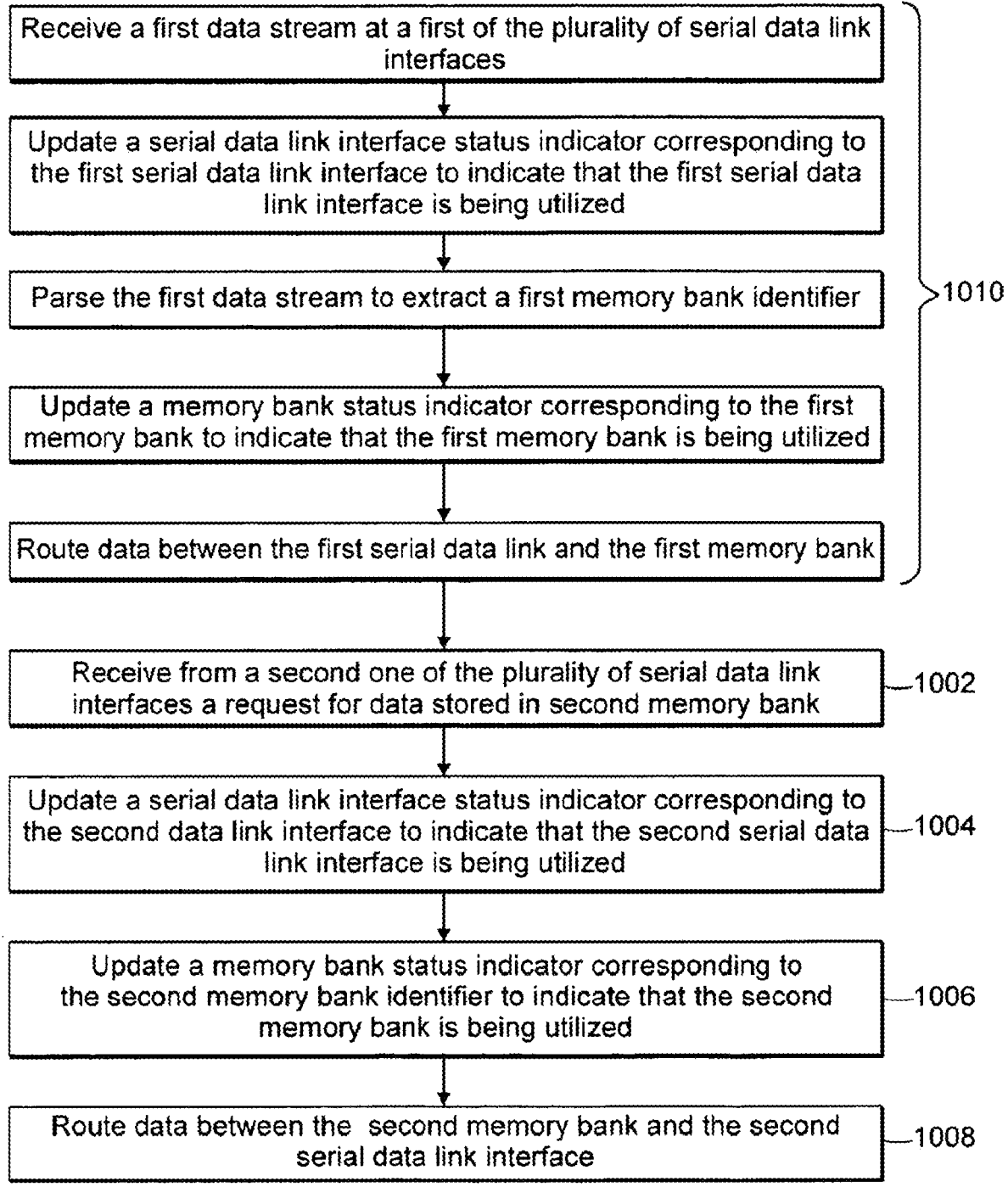

FIG. 10 comprises illustrative steps that may be performed when data is read from a memory bank concurrently with the writing of data shown in steps 902 to 910 in FIG. 9 (designated as steps 1010). FIG. 10 illustrates an example of some of the steps that may be performed in completing the concurrent memory operations diagrammed in FIG. 7. First in step 1002, a read request for data stored in a second memory bank is received from a second one of the plurality of serial data link interfaces. In step 1004, a serial data link interface status indicator corresponding to the second serial data link interface is updated to indicate that the second serial data link interface is being utilized. A memory bank status indicator corresponding to the second memory bank identifier is updated to indicate that the second memory bank is being utilized in step 1006. Finally, in step 1008 data is routed between the second memory bank and the second serial data link interface. One or more of the steps shown in FIG. 10 may be performed concurrently.

Returning to FIG. 1B, the memory device shown includes a single data link interface 120 configuration that uses a virtual multiple link. FIG. 1B can be implemented with the configuration of the input serial to parallel register 232 that has been previously described. More generally, the embodiment of FIG. 1B can be implemented with the memory device 200, but with only one of the two serial data links being used. In conventional flash memory, I/O pins are occupied until an operation is complete. Therefore, no operation can be asserted during device busy status, which reduces device availability and decreases overall performance. In the example depicted in FIG. 1B, any available memory bank checked by "read status" operation can be accessed after an operation has been initiated in one of the two memory banks. Subsequently, the memory device can utilize the serial data link to access available memory banks through the supplemental switch circuit. Therefore, in accordance with this aspect of the invention, a single link may be used to access multiple memory banks. This virtual multiple link configuration emulates multiple link operations using a single link.

Figure 12:
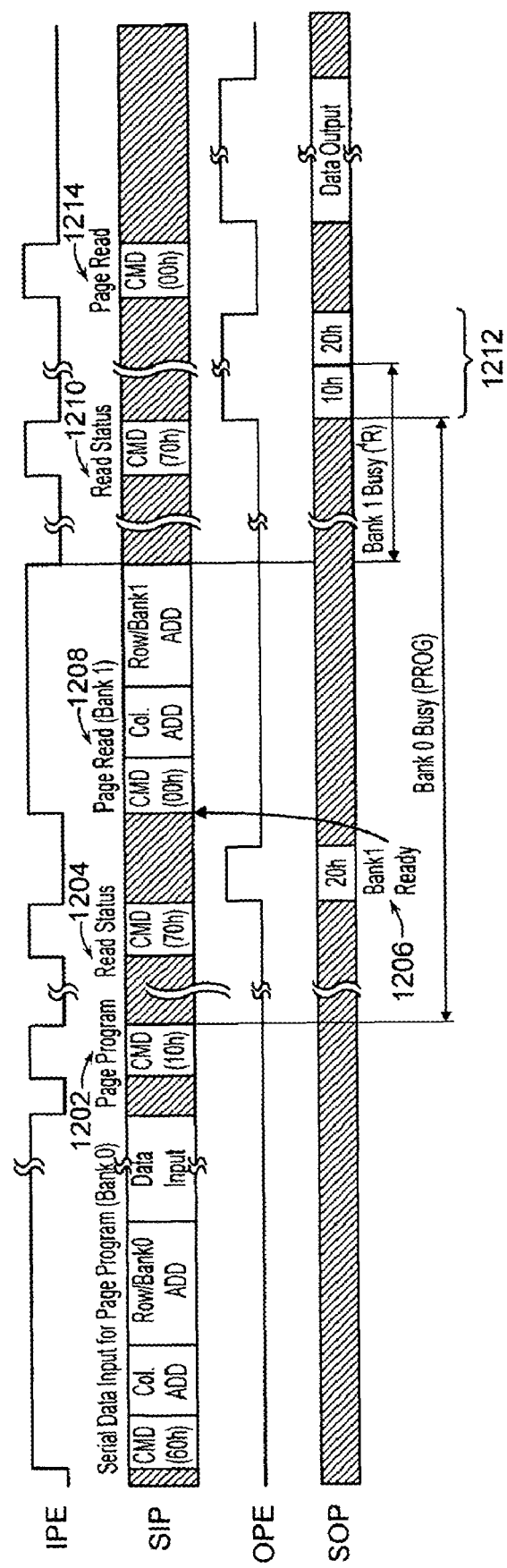
FIG. 12 illustrates timing diagrams for a memory operations performed in a memory device equipped with various aspects of the virtual multiple link feature in accordance with the invention.

FIG. 12 illustrates a timing diagram of a memory device with two memory banks performing memory operations using a virtual multiple link configureation in which a "page program" in bank 0 and "page read" in bank 1 are to be executed. First, a "page program" command 1202 directed at memory bank 0 is issued. The "page program" command has already been described earlier, but to recap, the "serial data input" command is first performed to load into the bank 0 page register that data to be programmed to bank 0. Subsequently, a "page program command is issued and the data is written from the page register into bank 0. When a "read status" command 1204 is issued device, the device indicates 1206 that bank 1 is "ready" (and that bank 0 is "busy"). Consequently, based on the virtual multiple link configuration in accordance with the invention, a "page read" command 1208 directed at memory bank 1 can be and is issued while memory bank 0 is busy. The "page read" command has been previously described. A "read status" command 1210 can be (and in FIG. 12 is shown to be) issued to determine the status of the memory banks. The result of the "read status" command indicates during interval 1212 that both memory bank 0 and memory bank 1 are ready. Finally, a "page read" command 1214 (for bank 1) is issued that results in the contents of the memory address corresponding to the bank 1 "page read" command to be outputted on the serial output pin (SOP). Note that while the "page program" operation on bank 0 is taking place, the serial data interface link pin SIP is available to receive the "read status" command which identifies bank 1 as "ready". Similarly, once the "page read" command on bank 1 has been initialized, the SIP pin is again available for a "read status" command, indicating that both banks 0 and 1 are now ready. As a result, the single serial data interface link can be used to access and check the status of both banks. Aspects of the virtual multiple link feature implemented in FIG. 12 illustrate that the link is available even while an earlier memory operation is pending. At least one benefit arising from this feature is the reduced pin count resulting from the virtual multiple link configuration. Another benefit is the increased performance of the memory device.

In addition, when aspects of the virtual multiple link feature are implemented with memory devices with dual or quad-link configurations, it may be desirable to consider all but one of the links as being inactive. For example, three of the four links in quad-link configuration (in FIG. 1C) may not be used and may be designated as NC (no connection). At least one benefit of such an implementation is a reduction in the number of pins on the memory device while maintaining link flexibility and availability.

Figure 13A:
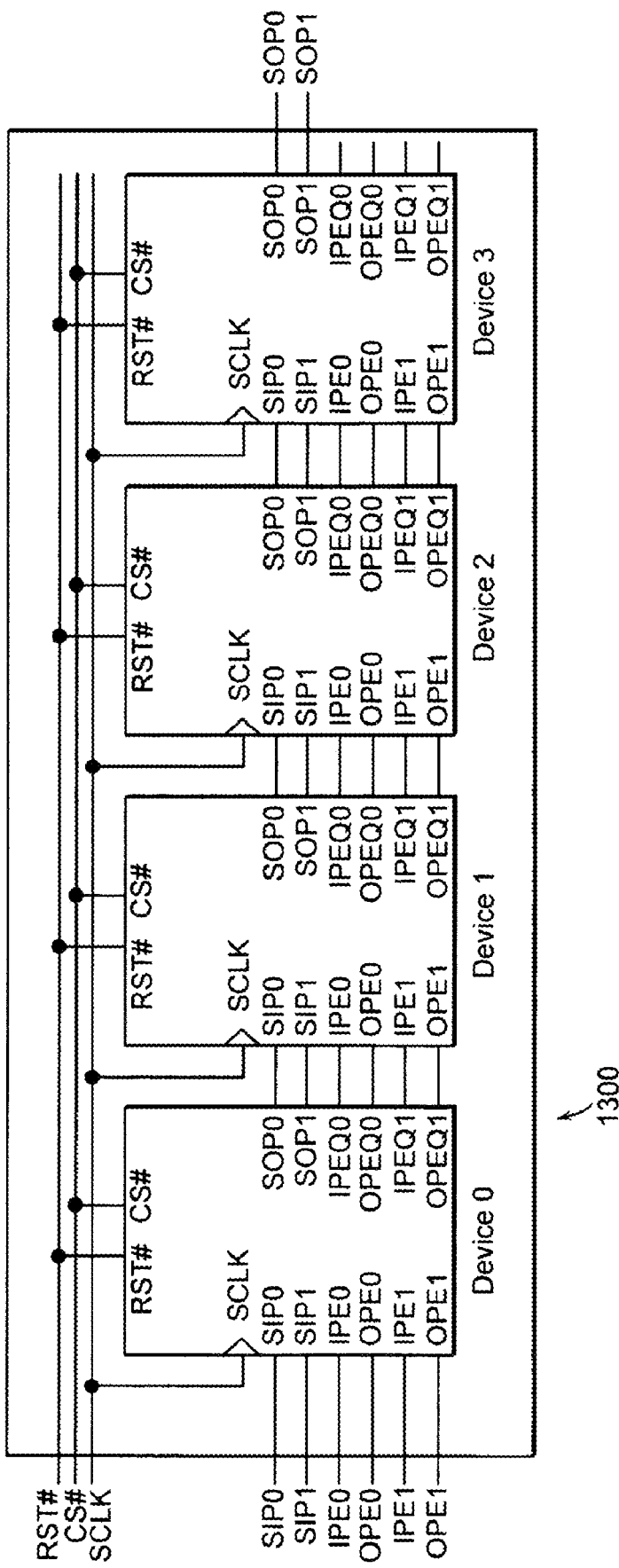
FIG. 13A depicts a high-level block diagram of a cascaded configuration of numerous memory devices in accordance with various aspects of the invention.

In accordance with various aspects of the invention, FIG. 13A illustrates a daisy-chain cascade configuration 1300 for serially connecting multiple memory devices 200. In particular, Device 0 is comprised of a plurality of data input ports (SIP0, SIP 1), a plurality of data output ports (SOP0, SOP1), a plurality of control input ports (IPE0, IPE1), and a plurality of control output ports (OPE0, OPE1). These data and control signals are sent to the memory device 1300 from an external source (e.g., memory controller (not shown)). Moreover, in accordance with the invention, a second flash memory device (Device 1) may be comprised of the same types of ports as Device 0. Device 1 may be serially connected to Device 0. For example, Device 1 can receive data and control signals from Device 0. One or more additional devices may also be serially connected alongside Device 0 and Device 1 in a similar manner. The final device (e.g., Device 3) in the cascade configuration provides data and control signals back to the memory controller after a predetermined latency. Each memory device 200 (e.g., device 0, 1, 2, 3) outputs an echo (IPEQ0, IPEQ1, OPEQ0, OPEQ1) of IPE0, IPE1, OPE0, and OPE1 (i.e., control output ports) to the subsequent device. The previously described circuits in FIG. 2B illustrate how the signals can be passed from one device to a subsequent daisy chained device. In addition, a single clock signal is communicated to each of the plurality of serially connected memory devices.

Figure 14:
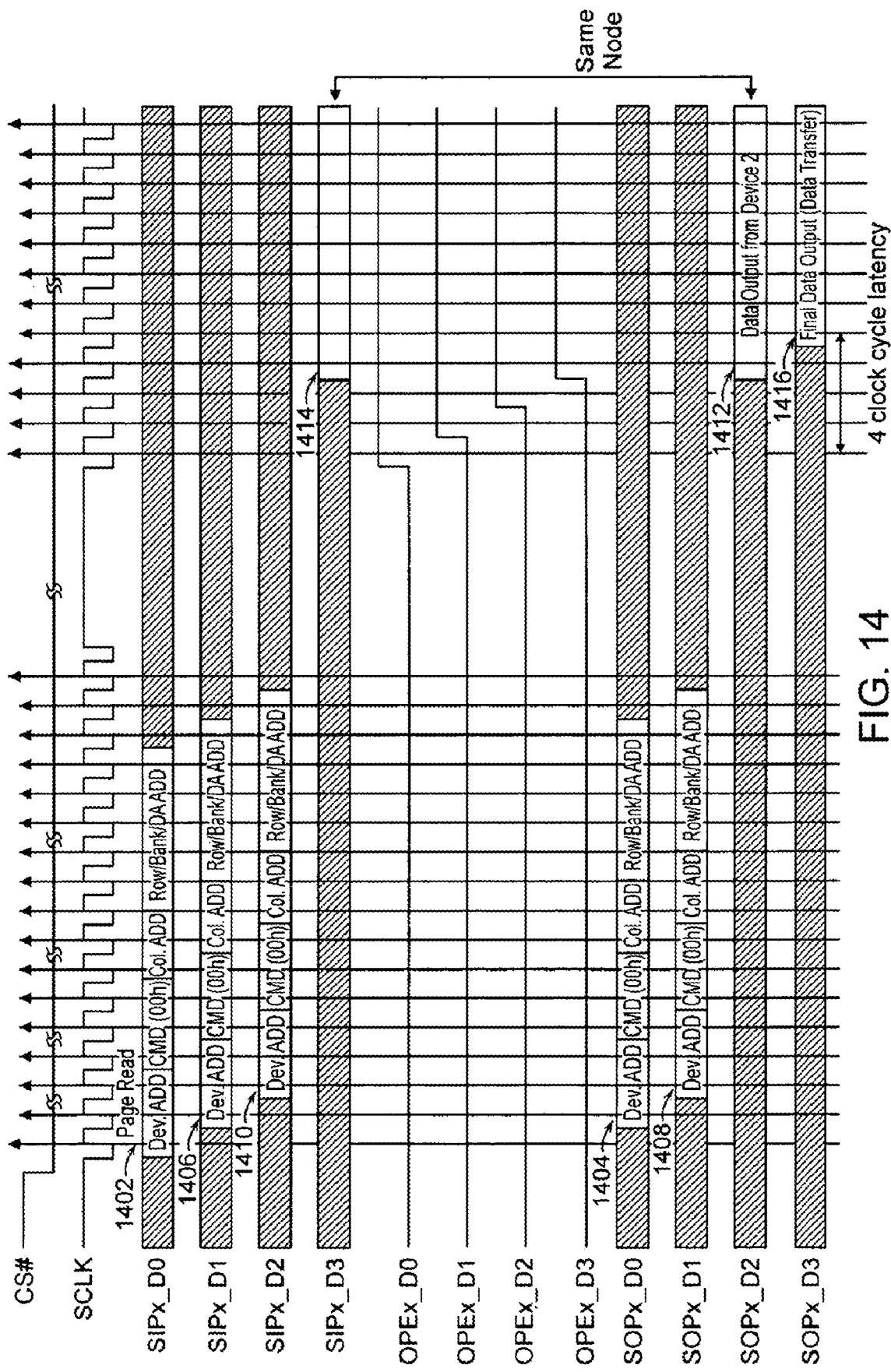
FIG. 14 illustrates a simplified timing diagram for a memory operation performed on a memory device in a cascaded configuration in accordance with aspects of the invention.

In the aforementioned cascade configuration, device operations of the cascaded memory device 1300 are the same as in a non-cascaded memory device 200. One skilled in the art will recognize that the overall latency of the memory device 1300 may be increased in a cascade configuration. For example, FIG. 14 depicts a highly-simplified timing diagram for a "page read" memory command 1402 received at memory device 1300 and directed at a memory bank in Device 2 in memory device 1300. The memory command is received at memory device 1300 and sent through Device 0 and Device 1 to Device 2. For example, the data stream corresponding to the "page read" command 1402 will be transferred from the SIP0 line of Device 0 in memory device 1300 through the circuitry of Device 0 and outputted at the SOP0 line of Device 0. The output of Device 0 is reflected in the simplified timing diagram in FIG. 14 on the SOPx_D0 output line at 1404. "SOPx_D0" corresponds to serial output port 0 on Device 0. Similarly, the data stream is subsequently received at SIPx_D1 on Device 1 (at 1406) and sent through Device 1 to be outputted by Device 1 on the SOPx_D1 line at 1408. Next, the data stream is received at SIPx_D2 on Device 2 at 1410. In this example, since the "page read" command is directed to a memory bank in Device 2, in a manner similar to that described for the circuitry in memory device 200, the circuitry in Device 2 receives the "page read" command and controls the transfer of the requested data from a memory bank in Device 2 to the SOPx_D2 output line on Device 2 at 1412. The data outputted by Device 2 is received at Device 3 at 1414 and transferred through Device 3 and outputted from memory device 1300. One skilled in the art will recognize from the simplified timing diagram of FIG. 14 that a predetermined latency of four clock cycles resulted due to the cascading configuration.

Meanwhile, the cascade configuration allows a virtually unlimited number of devices to be connected without sacrificing device throughput. Aspects of the invention may be beneficial in the implementation of multi-chip package solutions and solid state mass storage applications. The incoming data stream in a cascaded device 1300 is similar to that of a non-cascaded memory device 200, however, the first byte of the data stream may be preceded by a one-byte device identifier. For example, a value of "0000" in the first byte may indicate Device 0, while a value of "0001" may indicate Device 1. Once skilled in the art will understand that the device identifier need not necessarily be limited to one byte, but may be increased or decreased as desired. Also, the device identifier need not necessarily be positioned as the first byte in a data stream. For example, the size of the identifier may be increased to accommodate more devices in a cascaded configuration and be positioned with the address field of the data stream.

In one embodiment in accordance with the invention, the memory device 200 uses a single monolithic 4 Gb chip. In one-side pad architecture of a memory device in accordance with the invention, with fewer number of I/O, greatly reduces chip package size.

Figure 13B:
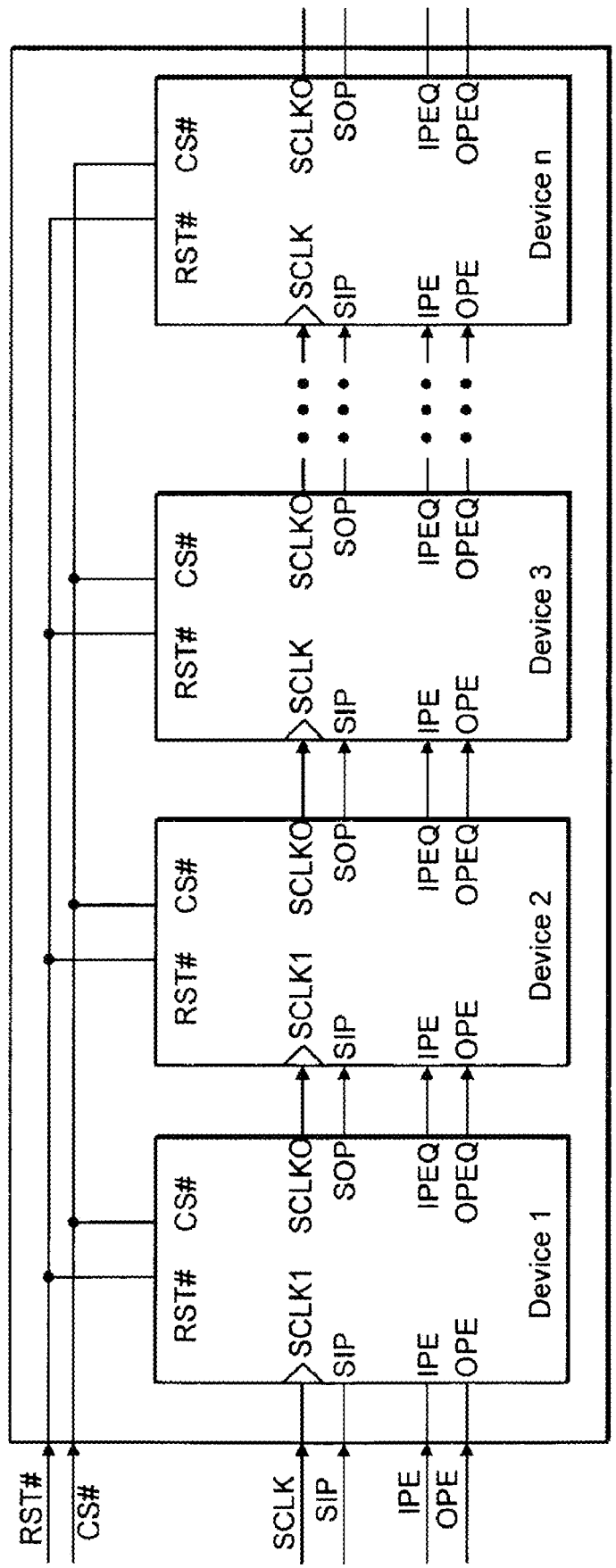
FIG. 13B depicts a high-level block diagram of an alternate cascaded configuration of numerous memory devices in accordance with various aspects of the invention.

FIG. 13B shows another example of system implementation of device connection in daisy-chain cascade configuration using a plurality of the memory devices 1500 illustrated in FIG. 15A. As described above with respect to FIGS. 15A and 15B, the memory devices include a single serial input port (SIP), a single serial output port (SOP), a pair of input enable (IPE) and output enable (OPE) ports, and corresponding pair of input enable echo (IPEQ) and output enable echo (OPEQ) ports. In this cascade configuration a serial clock output port (SCLKO) is added in every device. And serial clock input port name is changed to SCLKI in order to distinguish it from serial clock output port (SCLKO). Additional circuitry such as phase lock loop (PLL) or digital-phase lock loop (DLL) circuitry may be used in every device in order to match (or synchronize) any phase difference between SCLKI and SCLKO signals.

Examples of some of the operations of cascaded memory devices in for a Flash 5 core architecture implementation are shown in Table 3 below. Table 3 lists the target device address (TDA), possible OP (operation) codes and corresponding states of the column address, row/bank address, and the input data.

TABLE 3

Command Set

| Operation | Target Device Address (1 Byte) | OP Code (1 Byte) | Column Address (2 Bytes) | Row/Bank Address (3 Bytes) | Input Data (1 Byte to 2112 Bytes) |
| --- | --- | --- | --- | --- | --- |
| Page Read | tda | 00h | Valid | Valid | — |
| Random Data Read | tda | 05h | Valid | — | — |
| Page Read for Copy | tda | 35h | — | Valid | — |
| Target Address Input for Copy | tda | 8Fh | — | Valid | — |
| Serial Data Input | tda | 80h | Valid | Valid | Valid |
| Random Data Input | tda | 85h | Valid | — | Valid |
| Page Program | tda | 10h | — | — | — |
| Block Erase | tda | 60h | — | Valid | — |
| Read Status | tda | 70h | — | — | — |
| Read ID | tda | 90h | — | — | — |
| Write Configuration Register | tda | A0h | — | — | Valid (1 Byte) |
| Write DN (Device Name) Entry | 00h | B0h | — | — | — |
| Reset | tda | FFh | — | — | — |
| Bank Select | tda | 20h | — | Valid (Bank) | — | another embodiment, the memory device uses a pair of stacked chips for 8 Gb. In yet another embodiment, the memory device 1300 uses a stack of four chips to make up 16 Gb. A flash memory device in accordance with various aspects of the invention may be an improved solution for large nonvolatile storage applications such as solid state file storage and other portable applications desiring non-volatility. The memory device 1300 may benefit from a novel flash device cascade scheme for virtually unlimited number of linked devices to accommodate system integration with greater expandability and flexibility. The serial interface will provide additional performance improvement with higher clock rate, better signal integrity and lower power consumption. The serial interface also provides unlimited expandable I/O width without changing package configuration. Furthermore, the In some embodiments of the present invention, each device in system 1300 of FIG. 13A or in system 1310 of FIG. 13B may possess a unique device identifier that may be used as a target device address (tda) in the serial input data. When receiving the serial input data, a flash memory device may parse the target device address field in the serial input data, and determine whether the device is the target device by correlating the target device address with the unique device identification number of the device.

Table 4 shows a preferred input sequence of the input data stream in accordance with embodiments of the present invention, including the systems described in connection with FIGS. 13A and 13B. The commands, addresses, and data are serially shifted in and out of the memory device 1500, starting with the most significant bit. Serial input signal (SIP) is sampled at the rising edges of serial clock (SCLK) while Input Port Enable (IPE) is HIGH. Command sequences start with a one-byte target device address ("tda") and one-byte operation code, also referred interchangeably as a command code ("cmd" in Table 3). By starting the serial input signal with the one-byte target device address at the most significant bit, the device may parse the target device address field prior to processing any additional input data received. If the memory device is not the target device, it may transfer the serial input data to another device prior to processing, thus saving additional processing time and resources.

Figure 16A:
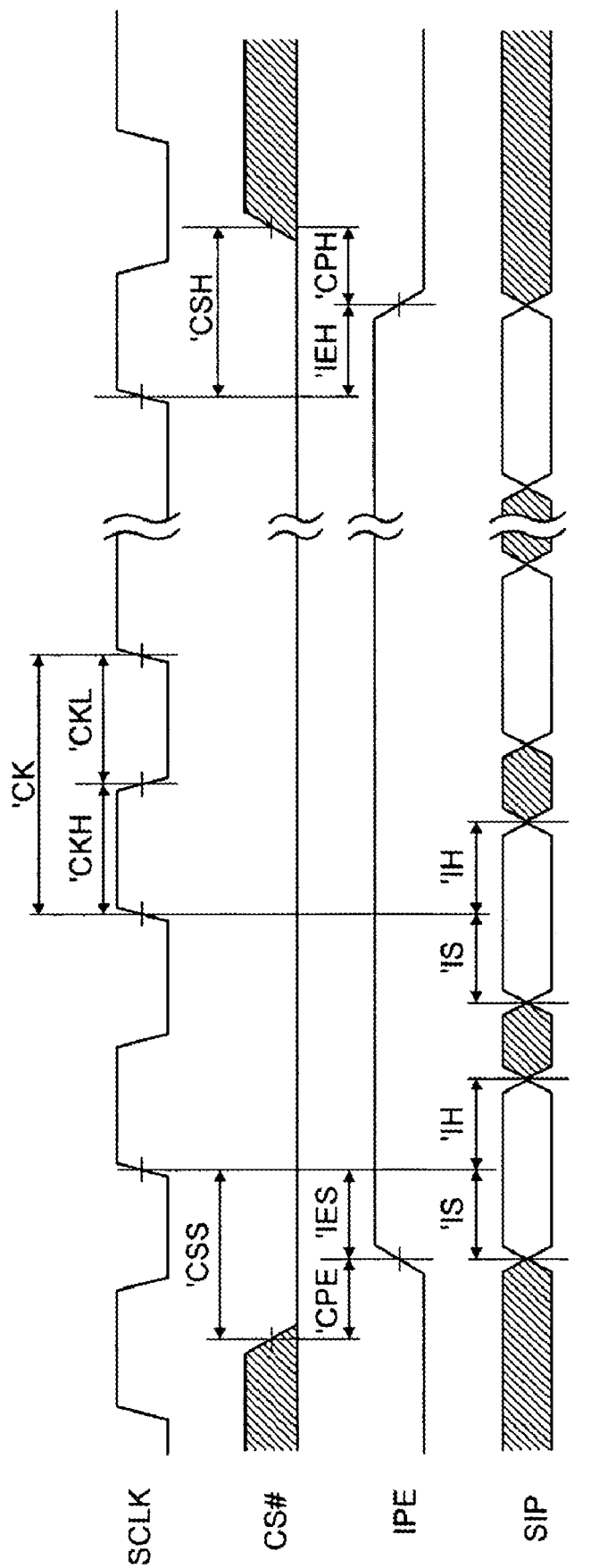

FIG. 16A illustrates basic input latch timing consistent with the principles of the present invention. When receiving data at a serial input port (SIP), TDA/Command/Address/Data-Inputs are asserted through the SIP port and captured on the rising edge of SCLK when CS# is LOW and IPE is HIGH. FIG. 16B is a clock diagram illustrating in detail the input sequence in byte mode. The input data must be shifted in to the device, most significant bit (MSB) first on SIP, each bit being latched at the rising edge of SCLK.

Figure 17A:
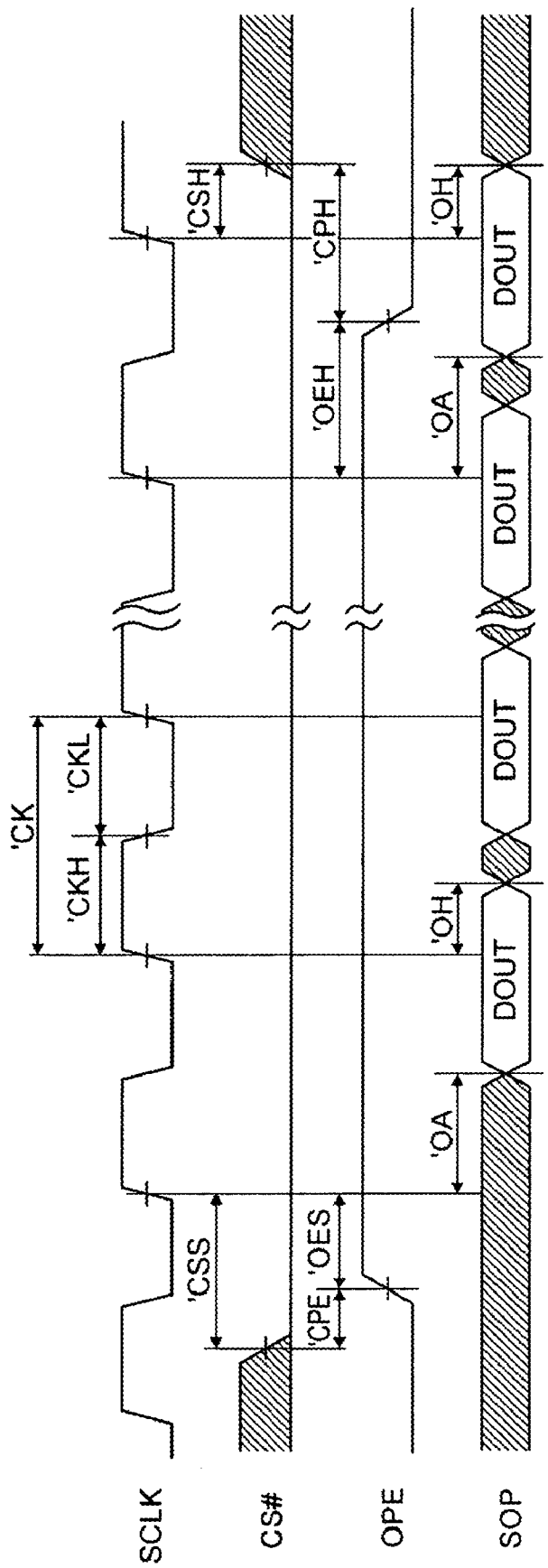
FIGS. 17A and 17B illustrate timing diagrams for output latch timing and output sequence timing byte mode, respectively.

FIG. 17A illustrates basic output latch timing consistent with principles of the present invention. When sending data from a device through serial output ports (SOP), data is

TABLE 4

Input Sequence in Byte Mode

| Operation | $1^{st}$ Byte | $2^{nd}$ Byte | $3^{rd}$ Byte | $4^{th}$ Byte | $5^{th}$ Byte | $6^{th}$ Byte | $7^{th}$ Byte | $8^{th}$ Byte | $2116^{th}$ ... Byte | $2119^{th}$ ... Byte |
|---|---|---|---|---|---|---|---|---|---|---|
| Page Read | tda | cmd | ca | ca | ra | ra | ra | — | — | — |
| Random Data Read | tda | cmd | ca | ca | — | — | — | — | — | — |
| Page Read for Copy | tda | cmd | ra | ra | ra | — | — | — | — | — |
| Target Address Input for Copy | tda | cmd | ra | ra | ra | — | — | — | — | — |
| Serial Data Input | tda | cmd | ca | ca | ra | ra | ra | data | ... data | ... data |
| Random Data Input | tda | cmd | ca | ca | data | data | data | data | ... data | — |
| Page Program | tda | cmd | — | — | — | — | — | — | — | — |
| Block Erase | tda | cmd | ra | ra | ra | — | — | — | — | — |
| Read Status | tda | cmd | — | — | — | — | — | — | — | — |
| Read ID | tda | cmd | — | — | — | — | — | — | — | — |
| Write Configuration Register | tda | cmd | data | — | — | — | — | — | — | — |
| Write DN Entry | tda | cmd | — | — | — | — | — | — | — | — |
| Reset | tda | cmd | — | — | — | — | — | — | — | — |

The 1-byte TDA is shifted into the device, followed by the 1-byte cmb code. The most significant bit (MSB) starts on the SIP and each bit is latched at the rising edges of serial clock (SCLK). Depending on the command, the one-byte command code may be followed by column address bytes, row address bytes, bank address bytes, data bytes, and/or a combination or none.

In embodiments of the present invention, the signal bus on a flash device is fully multiplexed. Commands, addresses and data input/outputs may share the same pin. As an example, the command sequence normally consists of one-byte target device address latch cycles, one-byte command latch cycles, address latch cycles (e.g. 2-bytes for column addresses, and 3-bytes for row addresses) and one byte or more (up to 2,112 bytes) data input latch cycles if required. Every set of command instructions is followed by two extra clock cycles after IPE makes a HIGH to LOW transition. In the case of a daisy-chain cascaded configuration, the clock cycle delay after IPE transitions to LOW may depend on the number of cascaded devices in the configuration. In embodiments of the present invention, the serial input sequence is "byte-based", which means that IPE and SIP should be valid for the unit of 8-clock cycles. If IPE makes a HIGH to LOW transition before the completion of full byte (i.e. 8 clock cycles), the corresponding command and/or address sequences will be ignored by device. For the case of data input sequence, the last incomplete byte of input data will be ignored, but prior complete byte(s) of input data will be valid.

Figure 17B:
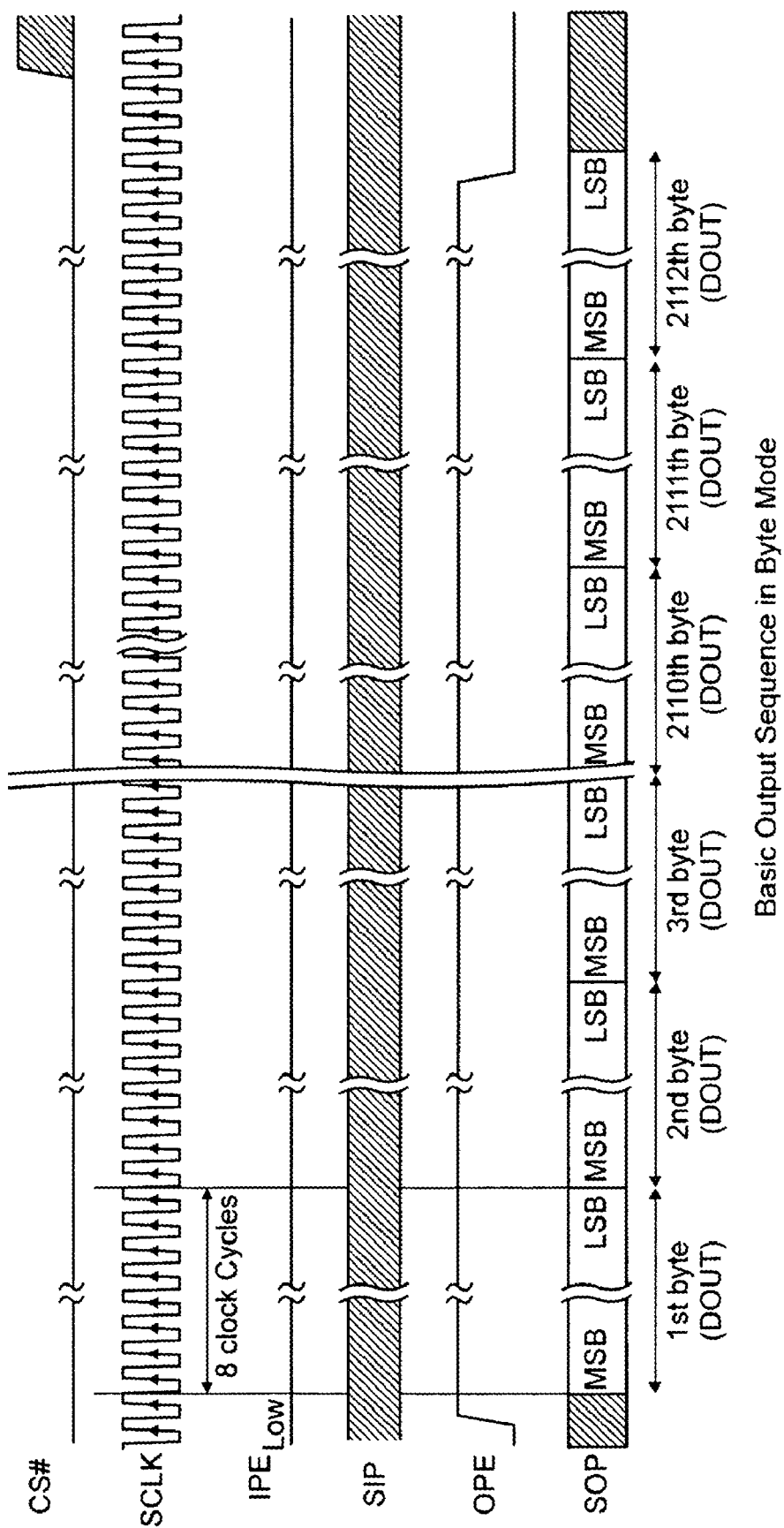

FIGS. 16A, 16B, 17A, and 17B illustrate example timing diagrams relating to the input and output latch timing of serial data at memory devices of the present invention.

asserted through SOP port on the rising edge of SCLK when CS# is LOW and OPE is HIGH. The serial data output on SOP is synchronously shifted out at the rising edge of SCLK. FIG. 17B is a clock diagram illustrating in detail the output sequence in byte mode. The output data is shifted from the device, most significant bit (MSB) first on SOP, each bit being synchronized at the rising edge of SCLK.

As stated earlier, the memory devices can be dual-bank memories, where each bank can be accessed by any serial link. Alternatively, in other embodiments of the invention, memory devices may include a single memory bank and single serial interface. The serial interface of the memory device greatly improves data throughput over traditional parallel interface schemes, while supporting feature-rich operations. For example, a program operation can be performed in 200 μs on a (2K+64) byte page and an erase operation can be performed in 1.5 ms on a (128K+4K) byte block. An on-clip write controller may be used to automate all program and erase functions including pulse repetition, where used, and internal verification and margining of data. In write-intensive systems, ECC (Error Correcting Code) with real time mapping-out algorithm may be used to enhance the extended reliability of 100K program/erase cycles in the memory device.

The usefulness of the various aspects of the invention should be apparent to one skilled in the art. The use of any and all examples or exemplary language herein (e.g., "such as") is intended merely to better illuminate the invention and does not pose a limitation on the scope of the invention unless otherwise claimed. No language in the specification should be construed as indicating any non-claimed element as essential to the practice of the invention.

The present invention has sometimes been described in terms of preferred and illustrative embodiments thereof. Numerous other embodiments, modifications and variations within the scope and spirit of the appended claims will occur to persons of ordinary skill in the art from a review of this disclosure.

What is claimed is:

1. A device into which a clock input (CLKI) signal is received, and out of which a clock output (CLKO) signal is transmitted, the device comprising:
    flash memory;
    input connections for receiving data, an output enable signal, and the CLKI signal that provides for synchronization with respect to the received data;
    output connections for transmitting the CLKO signal, and for transmitting the data in response to the output enable signal being held to a logic level for a number of edges of the CLKO signal that provides for other synchronization; and
    a Phase Lock Loop (PLL) to match any phase difference between the CLKI and CLKO signals.

2. The device as claimed in claim 1 wherein the other synchronization is synchronization with respect to the transmitted data.

3. The device as claimed in claim 1 wherein the CLKI signal is a Serial Clock Input (SCLKI) signal.

4. The device as claimed in claim 1 wherein the CLKO signal is a Serial Clock Output (SCLKO) signal.

5. The device as claimed in claim 1 further comprising circuits for capturing and storing the data in the flash memory.

6. The device as claimed in claim 1 wherein the input and output connections for receiving and transmitting data comprise data ports.

7. The device as claimed in claim 1 wherein the edges are one of rising edges, falling edges and both rising and falling edges of the CLKO signal.

8. The memory device as claimed in claim 1, wherein a first bit of the data is transmitted by the output connections after a first delay from the output enable signal being driven to the active state, and a last bit of the data is provided at a second delay after the output enable signal is driven to an inactive state.

9. A device into which a clock input (CLKI) signal is received, and out of which a clock output (CLKO) signal is transmitted, the device comprising:
    flash memory;
    input connections for receiving data, an output enable signal, and the CLKI signal that provides for synchronization with respect to the received data;
    output connections for transmitting the CLKO signal, and for transmitting the data in response to an output enable signal being held to a logic level for a number of edges of the CLKO signal that provides for other synchronization; and
    a DLL to match any phase difference between the CLKI and CLKO signals.

10. The device as claimed in claim 9 wherein the other synchronization is synchronization with respect to the transmitted data.

11. The device as claimed in claim 9 wherein the CLKI signal is a Serial Clock Input (SCLKI) signal.

12. The device as claimed in claim 9 wherein the CLKO signal is a Serial Clock Output (SCLKO) signal.

13. The device as claimed in claim 9 further comprising circuits for capturing and storing the data in the flash memory.

14. The device as claimed in claim 9 wherein the input and output connections for receiving and transmitting data comprise data ports.

15. The device as claimed in claim 9 wherein the number of edges are one of rising edges, falling edges and both rising and falling edges of the CLKO signal.

16. The memory device as claimed in claim 9, wherein a first bit of the data is transmitted by the output connections after a first delay from the output enable signal being driven to the active state, and a last bit of the data is provided at a second delay after the output enable signal is driven to an inactive state.

17. A flash memory system having a plurality of serially connected flash memory devices comprising:
    a first flash memory device having a plurality of data input ports for receiving data from an external source, a plurality of data output ports for providing data received at the data input ports, a plurality of control input ports for receiving at least an output enable signal from the external source, and a plurality of control output ports for providing at least the output enable signal, and the first flash memory device being configured to provide the data in response to the output enable signal; and
    a second flash memory device having a plurality of data input ports for receiving the data provided from the data output ports of the first flash memory device, a plurality of data output ports for providing the data received at the data input ports, a plurality of control input ports for receiving at least the output enable signal, and a plurality of control output ports for providing at least the output enable signal, and the second flash memory device being configured to provide the data in response to the output enable signal.

18. The flash memory system of claim 17 wherein the plurality of control output ports of the first flash memory device provide echoing values received at the control input ports of the first flash memory device to the second flash memory device.

19. The flash memory system of claim 17 wherein the external source is a memory controller.

20. The flash memory system of claim 17 wherein each of the plurality of serially connected flash memory devices further comprise a plurality of flash memory blocks and a plurality of serial data link interfaces.

21. The flash memory system of claim 20 wherein the plurality of flash memory blocks comprise a plurality of flash memory banks.

22. A device into which a clock input (CLKI) signal is received, the device comprising:
    flash memory;
    at least one port for receiving a command, the CLKI signal providing synchronization with respect to the command;
    control signal ports for receiving two control signals, the command being latched on edges of the CLKI signal while only one of the two control signals is held at a logic level for at least a duration of time the command is provided to the device; and,
    core circuitry for executing an operation corresponding to the command.

23. The device of claim 22, wherein the duration of time corresponds to a number of edges of the CLKI signal.

24. The device of claim 23, wherein the number of edges corresponds to one of rising edges, falling edges and both rising and falling edges of the CLKI signal.

25. The device of claim 22, wherein the only one of the two control signals is held at the logic level while the command is provided to the device.

26. The device of claim 25, wherein the only one of the two control signals transitions from an inactive logic level to an active logic level synchronously with an edge of the CLKI signal, and transitions from the active logic level to the inactive logic level synchronously with another edge of the CLKI signal.

27. The device of claim 22, wherein the at least one port includes a data port that latches data on edges of the CLKI signal while the only one of the two control signals is held at a logic level for a duration of time the data is provided to the device.

28. The device of claim 22, wherein the one of the two control signals is an input enable signal, and the other of the two control signals is an output enable signal.

29. The device of claim 28, wherein the device further includes
   read circuitry configured to obtain read data from said flash memory to facilitate subsequent transmission of the read data; and,
   an output buffer configured to receive the read data and to transmit the read data through an output port in response to the output enable signal, the output enable signal being held at another logic level for a period of time that delineates a length of said read data transmitted from said output port.

* * * * *